United States Patent
Park et al.

(10) Patent No.: US 10,727,078 B2
(45) Date of Patent: Jul. 28, 2020

(54) METHODS OF FORMING FINE PATTERNS

(71) Applicant: SAMSUNG ELECTRONICS CO., LTD., Suwon-si, Gyeonggi-do (KR)

(72) Inventors: Jeong Ju Park, Hwaseong-si (KR); Kyeongmi Lee, Suwon-si (KR); Seungchul Kwon, Suwon-si (KR); Eunsung Kim, Seoul (KR); Shiyong Yi, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 642 days.

(21) Appl. No.: 15/370,290

(22) Filed: Dec. 6, 2016

(65) Prior Publication Data

US 2017/0213744 A1 Jul. 27, 2017

(30) Foreign Application Priority Data

Jan. 26, 2016 (KR) .................. 10-2016-0009467

(51) Int. Cl.
*H01L 21/027* (2006.01)
*H01L 21/311* (2006.01)
*H01L 21/308* (2006.01)
*H01L 21/033* (2006.01)
*H01L 21/3105* (2006.01)
*H01L 21/02* (2006.01)

(52) U.S. Cl.
CPC .... *H01L 21/31144* (2013.01); *H01L 21/0276* (2013.01); *H01L 21/0332* (2013.01); *H01L 21/0337* (2013.01); *H01L 21/3086* (2013.01); *H01L 21/31058* (2013.01); *H01L 21/02118* (2013.01); *H01L 21/02318* (2013.01); *H01L 21/31133* (2013.01)

(58) Field of Classification Search
CPC ............. H01L 21/0276; H01L 21/0337; H01L 21/0332; H01L 21/31058; H01L 21/3086; G03F 7/0035
USPC ...................................................... 430/273.1
See application file for complete search history.

(56) References Cited

U.S. PATENT DOCUMENTS

| | | | |
|---|---|---|---|
| 8,137,893 B2 * | 3/2012 | Burns | G03F 7/40 430/270.1 |
| 8,263,323 B2 | 9/2012 | Yoon et al. | |
| 8,334,089 B2 | 12/2012 | Yi et al. | |
| 8,691,925 B2 | 4/2014 | Wu et al. | |
| 8,715,917 B2 | 5/2014 | Holmes et al. | |
| 8,853,101 B1 | 10/2014 | Farrell et al. | |
| 8,962,491 B2 | 2/2015 | Ban et al. | |
| 9,023,222 B2 | 5/2015 | Kawanishi et al. | |
| 9,190,274 B2 | 11/2015 | Ban et al. | |
| 9,249,013 B2 | 2/2016 | Wang et al. | |
| 2013/0078576 A1 * | 3/2013 | Wu | C08F 293/00 430/296 |
| 2014/0353762 A1 | 12/2014 | Guillorn et al. | |
| 2015/0031210 A1 * | 1/2015 | Ban | H01L 21/0338 438/703 |
| 2015/0050794 A1 | 2/2015 | Kim et al. | |
| 2015/0243525 A1 | 8/2015 | Park et al. | |
| 2016/0077435 A1 * | 3/2016 | Ban | G03F 7/11 430/315 |

FOREIGN PATENT DOCUMENTS

JP 2015-106639 A 6/2015

* cited by examiner

*Primary Examiner* — Daborah Chacko-Davis
(74) *Attorney, Agent, or Firm* — Volentine, Whitt & Francos, PLLC

(57) ABSTRACT

A method of forming fine patterns includes forming a mask on an etching target, forming an anti-reflective layer on the mask, forming fixing patterns such that top surfaces of the anti-reflective layer and fixing patterns are exposed, forming a block copolymer layer including first and second polymer blocks, and phase-separating the block copolymer layer to form first patterns and second patterns on the anti-reflective layer and the fixing patterns. The first and second patterns include the first and second polymer blocks, respectively. The anti-reflective layer has a neutral, i.e., non-selective, interfacial energy with respect to the first and second polymer blocks. The fixing patterns have a higher interfacial energy with respect to the first polymer block than the second polymer block.

16 Claims, 22 Drawing Sheets

METHODS OF FORMING FINE PATTERNS

PRIORITY STATEMENT

This U.S. non-provisional patent application claims priority under 35 U.S.C. § 119 of Korean Patent Application 10-2016-0009467 filed on Jan. 26, 2016, the entire contents of which are hereby incorporated by reference.

BACKGROUND

The present inventive concept relates to a method of fabricating a semiconductor device and, more particularly, to a method of forming fine patterns.

It is essential to form fine patterns in manufacturing highly-integrated semiconductor devices. In order to integrate many cells within a small area, the size of the individual cells needs to be minimized. In order to form small cells, a pitch corresponding to a sum of a width of each pattern to be formed and an interval between adjacent patterns should be designed to be small. With the recent rapid reduction in design rule of semiconductor devices, there is a limit to the fineness of the pitch which can be attained due to a resolution limit in photolithography for forming patterns required to manufacture semiconductor devices.

SUMMARY

According to the present inventive concept, there is provided a method of forming fine patterns, comprising: forming a mask on an etching target layer, forming on the mask an anti-reflective layer and fixing patterns such that top surfaces of the anti-reflective layer and fixing patterns are exposed, forming a block copolymer layer that covers the top surfaces of the anti-reflective layer and the fixing patterns and includes a first polymer block and a second polymer block different from each other, and phase-separating the block copolymer layer to form first patterns and second patterns on the anti-reflective layer and the fixing patterns. Each of the first patterns includes the first polymer block, and each of the second patterns includes the second polymer block. Also, the anti-reflective layer has a non-selective neutral interfacial energy with respect to the first polymer block and the second polymer block, and the fixing patterns have a higher interfacial energy with respect to the first polymer block than the second polymer block.

According to the present inventive concept, there is also provided a method of forming fine patterns, comprising: forming a mask on an etch target, forming on the mask a self-assemble guide layer structure comprising an anti-reflective (AR) layer and a layer of fixing patterns, wherein the fixing patterns are spaced from each other and top surfaces of the AR layer and fixing patterns are exposed, forming a layer of a block copolymer directly on the exposed top surfaces of the AR layer and the fixing patterns of the self-assemble guide layer structure, the block copolymer including first and second blocks of different polymers, treating the block copolymer layer to cause the first and second blocks to self-arrange on the top surfaces of the AR layer and the fixing patterns of the self-assemble guide layer structure, thereby forming first patterns and second patterns of the first and second blocks, respectively, removing the second patterns, and subsequently performing an etch process using the first patterns as an etch mask.

According to the present inventive concept, there is also provided a method of forming fine patterns, comprising: forming a mask on an etch target, forming on the mask a self-assemble guide layer structure comprising an anti-reflective (AR) layer and a layer of fixing patterns, and in which the fixing patterns are spaced from each other in a direction parallel to a top surface of the etch target and top surfaces of the AR layer and the fixing patterns are exposed, and forming first patterns and second patterns of first and second blocks, respectively, of different polymers of a block copolymer, directly on the AR layer and the layer of fixing patterns of the self-assemble guide layer structure. The first patterns are alternately disposed with the second patterns, and in this process of forming patterns the first and second blocks of the block copolymer self-arrange on the top surfaces of the fixing patterns such that the number of the first patterns disposed on each of the fixing patterns is n, and the number of the second patterns disposed on each of the fixing patterns is n−1, wherein n is an integer of 2 or more. Then the second patterns are removed and subsequently an etch process is performed using the first patterns as an etch mask.

BRIEF DESCRIPTION OF THE DRAWINGS

The accompanying drawings are included to provide a further understanding of the inventive concept, and are incorporated in and constitute a part of this specification. The drawings illustrate examples of the inventive concept and, together with the description, serve to explain principles of the inventive concept. In the drawings.

DETAILED DESCRIPTION

Hereinafter, the present inventive concept will be described in detail in conjunction with the accompanying drawings.

FIGS. 1A through 9B illustrate some examples of a method of forming fine patterns according to the present inventive concept.

Figure 1A:
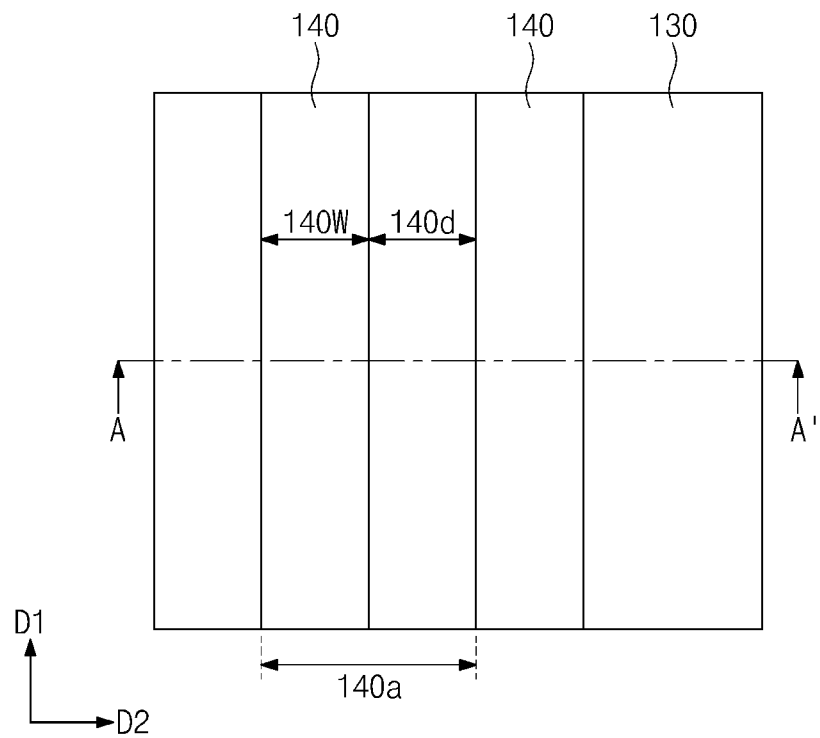
FIGS. 1A, 2A, 3A, 4A, 5A, 6A, 7A, 8A, and 9A are plan views of a structure of a semiconductor device during the course of its manufacture and together illustrate examples of a method of forming fine patterns according to the present inventive concept.
Figure 1B:
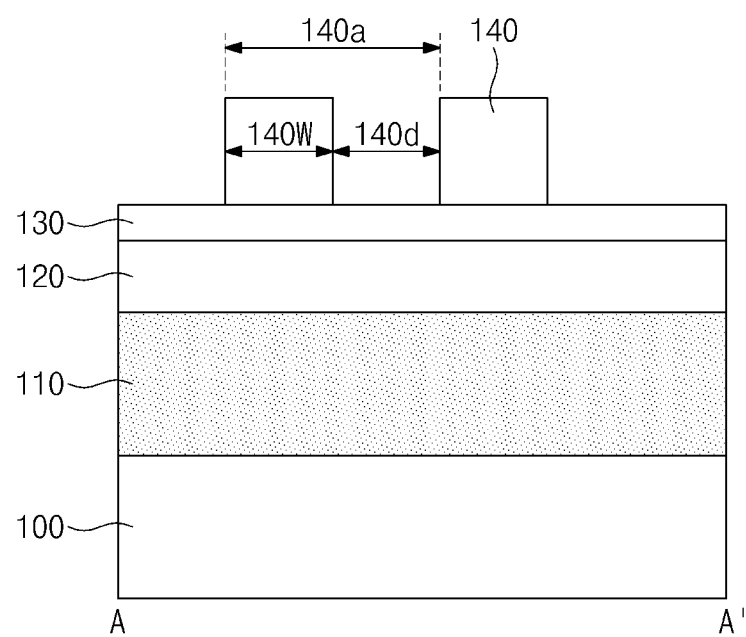
FIGS. 1B, 2B, 3B, 4B, 5B, 6B, 7B, 8B and 9B are cross-sectional views taken along line A-A' of FIGS. 1A through 9A, respectively.

Referring to FIGS. 1A and 1B, a lower mask layer 110 and an upper mask layer 120 may be sequentially stacked on an etching target layer 100. More generally speaking, the lower mask layer 110 may be referred to as a lower mask, the upper mask layer 120 may be referred to as an upper mask, and the etch target layer 100 may be referred to as an etch target. Thus, for example, the etching target layer 100 may comprise a semiconductor substrate (e.g., a silicon substrate, a germanium substrate, a silicon-germanium substrate, etc.), or an overlying layer formed on the semiconductor substrate. The etching target layer 100 may comprise an inorganic compound of silicon. For example, the etching target layer 100 may comprise at least one of Si, SiO2, SiON, and SiCN. The etching target layer 100 may be formed by, for example, a spin coating process and/or a deposition process. The lower mask layer 110 may comprise an organic compound containing at least 80% by weight of carbon. For example, the lower mask layer 110 may be constituted by a spin on hardmask (SOH) layer and/or an amorphous carbon layer (ACL). The lower mask layer 110 may be formed by, for example, a spin coating process and/or a deposition process. The upper mask layer 120 may comprise an inorganic compound of silicon. For example, the upper mask layer 120 may comprise at least one of Si, SiO2, SiON, and SiCN. The upper mask layer 120 may be formed by, for example, a spin coating process and/or a deposition process.

An anti-reflective layer 130 may be formed on the upper mask layer 120. For example, the anti-reflective layer 130 may comprise an organic ARC (anti-reflective coating) material and may be formed by a spin coating process. The anti-reflective layer 130 may comprise, for example, an aromatic vinyl compound. The aromatic vinyl compound may be, for example, vinylnaphthalene, acenaphthylene, or vinylcarbazole.

The anti-reflective layer 130 may control reflectivity of light used in a photolithography process. The composition, thickness, absorbance, etc., of the anti-reflective layer 130 may be selected to provide a desired degree of control of the reflectivity. The anti-reflective layer 130 may have a neutral interfacial energy with respect to polymer blocks constituting a block copolymer which is described below. Specifically, the block copolymer may comprise first and second polymer blocks that are different from each other, and the anti-reflective layer 130 may have a non-selective neutral interfacial energy with respect to the first and second polymer blocks. In other words, the anti-reflective layer 130 may non-selectively combine with the first and second polymer blocks.

A photoresist pattern 140 may be formed on the anti-reflective layer 130. The photoresist pattern 140 may comprise a positive resist composition used in a positive-tone development (PTD) process or a negative resist composition used in a negative-tone development (NTD) process. The photoresist pattern 140 may have a line and space pattern so as to have linear segments of photoresist extending longitudinally in a first direction D1 substantially parallel to a top surface of the etching target layer 100, and spaced apart from each other in a second direction D2 that extends substantially parallel to the top surface of the etching target layer 100 and crosses the first direction D1. For ease of description, these linear segments may themselves be referred to hereinafter as photoresist patterns 140. A pitch 140a of the photoresist patterns 140 may be a sum of a width 140W of a single photoresist pattern 140 in the second direction D2 and a distance 140d between the adjacent photoresist patterns 140 in the second direction D2. In some examples, a ratio of the width 140W to the distance 140d may be about 1:1.

Figure 2A:
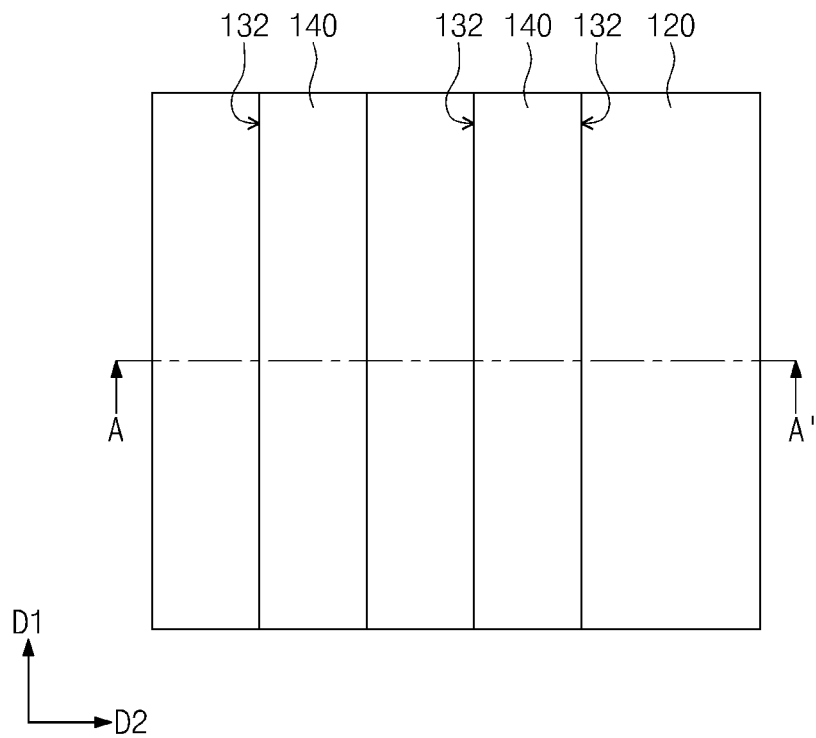
Figure 2B:
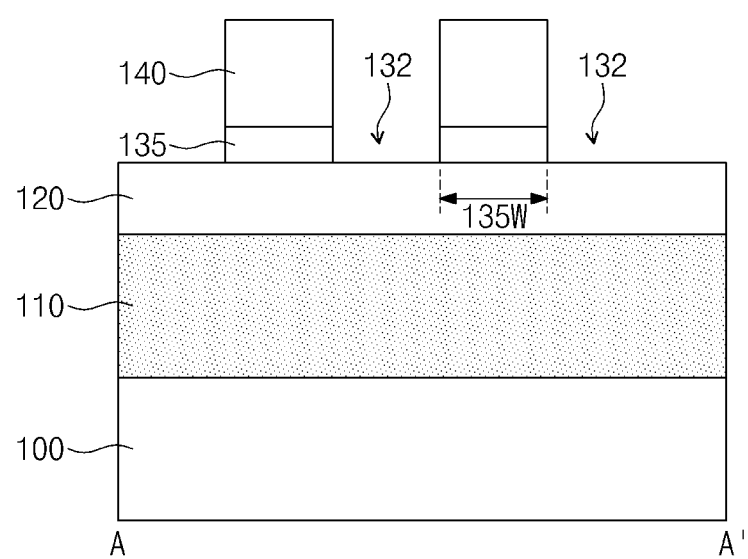

Referring to FIGS. 2A and 2B, the anti-reflective layer 130 may be etched using the photoresist patterns 140 as an etch mask to form openings 132 through which a top surface of the upper mask layer 120 is exposed. The openings 132 may divide the anti-reflective layer 130 into anti-reflective patterns 135. The anti-reflective patterns 135 may each have a linear shape, may extend longitudinally in the first direction D1 and may be spaced apart from each other in the second direction D2. In other words, the anti-reflective layer 130 may be discontinuous in the direction D2. Each of the anti-reflective patterns 135 may have a width 135W in the second direction D2. In some examples, the width 135W of each of the anti-reflective patterns 135 may be substantially the same as the width 140W of each of the photoresist patterns 140.

Figure 3A:
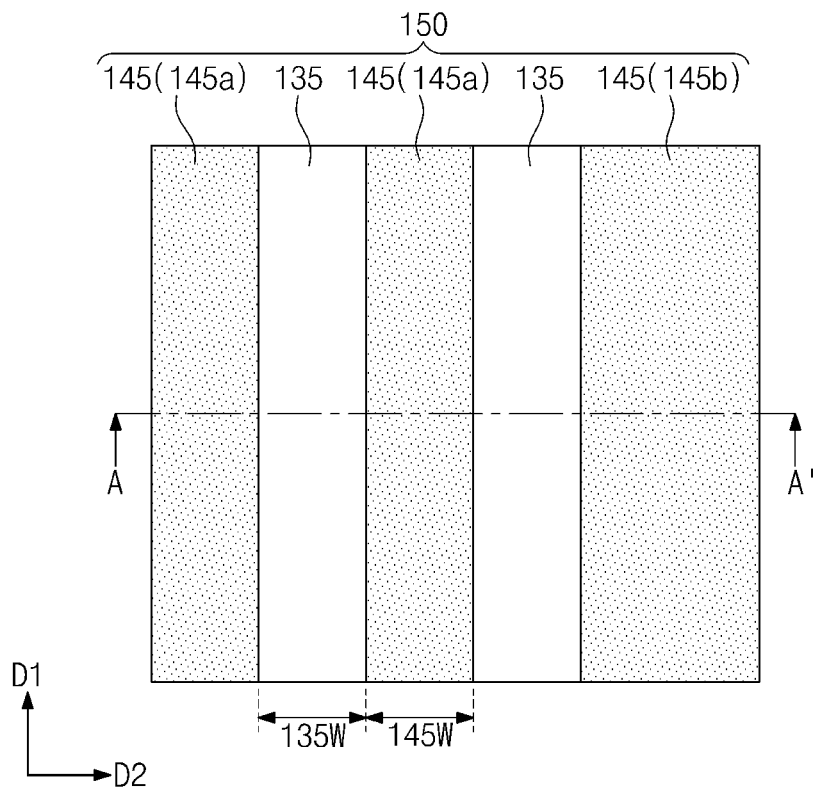
Figure 3B:
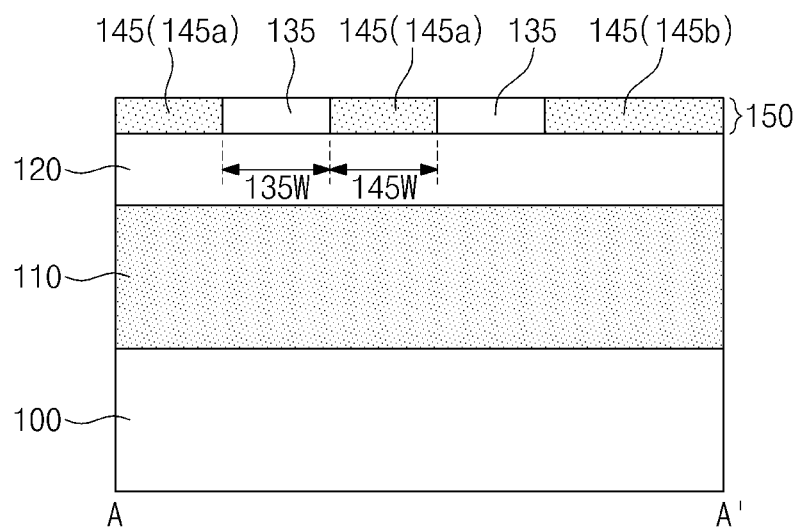

Referring to FIGS. 3A and 3B, the photoresist patterns 140 are removed and fixing patterns 145 may be formed in the openings 132. The fixing patterns 145 may be formed to respectively fill the openings 132. The fixing patterns 145 may be formed to locally fill the openings 132, and thus the fixing patterns 145 may not cover top surfaces of the anti-reflective patterns 135. The fixing patterns 145 may each have a linear shape, may extend longitudinally in the first direction D1, and may be spaced apart from each other in the second direction D2. The anti-reflective patterns 135 and the fixing patterns 145 may be alternately and repetitively arranged in the second direction D2. The anti-reflective patterns 135 and the fixing patterns 145 may have bottom surfaces in contact with the top surface of the upper mask layer 120.

Each of the fixing patterns 145 may have a width in the second direction D2. The fixing patterns 145 may comprise narrow fixing patterns 145a having a relatively small width and a wide fixing pattern 145b having a relatively large width. In some examples, each of the narrow fixing patterns 145a may have a width 145W substantially the same as the distance 140d between the photoresist patterns 140. In other words, the pitch 140a of the photoresist patterns 140 may be substantially the same as a sum of the width 135W of each of the anti-reflective patterns 135 and the width 145W of each of the narrow fixing patterns 145a. In some examples, a ratio of each width 135W of the anti-reflective patterns 135 to each width 145W of the narrow fixing patterns 145a may be about 1:1. The wide fixing pattern 145b may have a width greater than the width 145W of each of the narrow fixing patterns 145a.

The fixing patterns 145 may have a high interfacial energy with respect to one of the blocks constituting a block copolymer which is described below. Specifically, the block copolymer may comprise a first polymer block and a second polymer block that are different from each other, and the fixing patterns 145 may have a higher interfacial energy with respect to the first polymer block than the second polymer block. In other words, the fixing patterns 145 may selectively combine with the first polymer block. The fixing patterns 145 may comprise a polymer substantially the same as the first polymer block.

The forming of the fixing patterns 145 may comprise removing the photoresist patterns 140 after forming the openings 132, forming, on the upper mask layer 120, a polymer layer covering the anti-reflective patterns 135 and filling the openings 132, reacting the polymer layer with the upper mask layer 120 which is exposed through the openings 132, and removing a remaining portion of the polymer layer which is not reacted with the upper mask layer 120. The polymer layer may comprise a polymer substantially the same as the first polymer block, and the polymer may contain at least one functional group, which can be covalently bonded with silanol (Si—OH) of the upper mask layer 120, at its end or backbone. For example, the polymer may comprise at least one of a hydroxyl (—OH) group and a carboxyl (—COOH) group. The polymer layer may be formed by a coating process. For example, a bake process may be employed to react the polymer layer with the upper mask layer 120 which is exposed through the openings 132. In this case, a functional group of the polymer layer may be covalently bonded with the silanol (Si—OH) of the upper mask layer 120, and thus the polymer layer may be attached to the upper mask layer 120 which is exposed through the openings 132. The fixing patterns 145 may be locally formed in the openings 132 because of the removal of the remaining portion of the polymer layer which is not reacted with the upper mask layer 120. An organic solvent (e.g., PGMEA (propylene glycol methyl ether acetate), etc.) may be used to remove the remaining portion of the polymer layer.

The anti-reflective patterns 135 and the fixing patterns 145 may define a self-assemble guide layer 150.

Figure 4A:
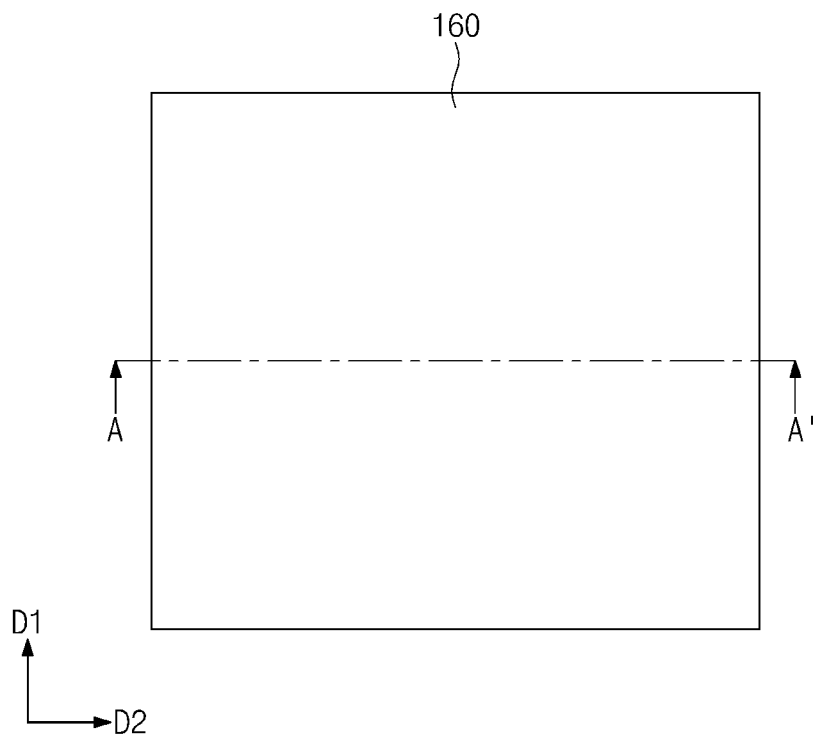
Figure 4B:
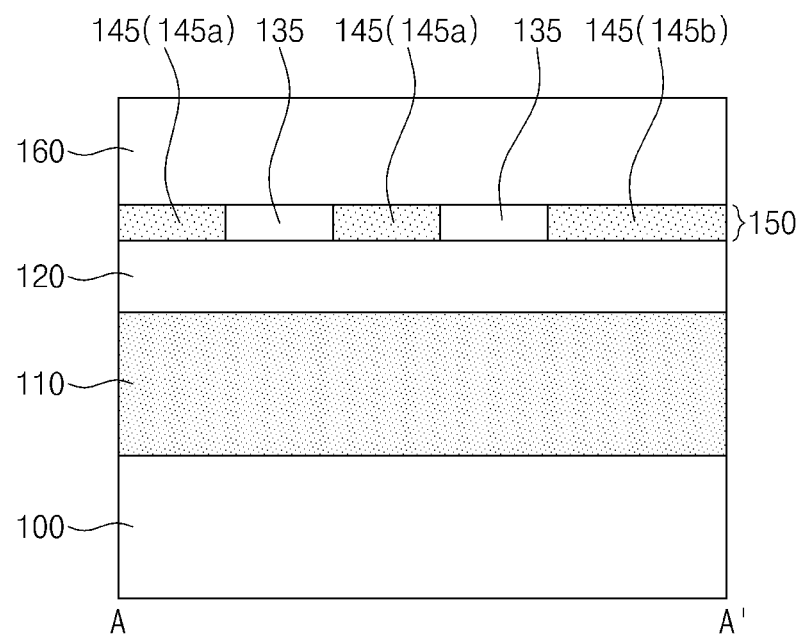

Referring to FIGS. 4A and 4B, a block copolymer layer 160 may be formed on the self-assemble guide layer 150. The block copolymer layer 160 may comprise a block copolymer that includes first and second polymer blocks which are different from each other and are linked to each other through a covalent bond. The block copolymer may include a linear or branched polymer. In some examples, the first polymer block and the second polymer block may be covalently bonded at a volume ratio of about 1:1. The block copolymer may include at least one of polystyrene-polymethylmethacrylate copolymer, polybutadiene-polybutylmethacrylate copolymer, polybutadiene-polydimethylsiloxane copolymer, polybutadienepolymethylmethacrylate copolymer, polybutadiene-polyvinylpyridine copolymer, polybutylacrylate-polymethylmethacrylate copolymer, polybutylacrylate-polyvinylpyridine copolymer, polyisoprene-polyvinylpyridine copolymer, polyisoprenepolymethylmethacrylate copolymer, polyhexylacrylatepolyvinylpyridine copolymer, polyisobutylenepolybutylmethacrylate copolymer, polyisobutylenepolymethylmethacrylate copolymer, polyisobutylenepolybutylmethacrylate copolymer, polyisobutylene-polydimethylsiloxane copolymer, polybutylmethacrylate-polybutylacrylate copolymer, polyethylethylene-polymethylmethacrylate copolymer, polystyrene-polybutylmethacrylate copolymer, polystyrene-polybutadiene copolymer, polystyrene-polyisoprene copolymer, polystyrene-polydimethylsiloxane copolymer, polystyrene-polyvinylpyridine copolymer, polyethylethylenepolyvinylpyridine copolymer, polyethylene-polyvinylpyridine copolymer, polyvinylpyridine-polymethylmethacrylate copolymer, polyethyleneoxide-polyisoprene copolymer, polyethyleneoxide-polybutadiene copolymer, polyethyleneoxidepolystyrene copolymer, polyethyleneoxidepolymethylmethacrylate copolymer, polyethyleneoxide-polydimethylsiloxane copolymer, polystyrene-polyethyleneoxide copolymer, but the present inventive concept is not limited thereto. The block copolymer layer 160 may be formed by, for example, a spin coating process.

In some examples, when the block copolymer is a polystyrene-polymethylmethacrylate (PS-PMMA) copolymer, the first polymer block may be polystyrene (PS) and the second polymer block may be polymethylmethacrylate (PMMA). In this case, the anti-reflective layer 130 may have a non-selective neutral interfacial energy with respect to the first polymer block (e.g., PS) and the second polymer block (e.g., PMMA). In other words, the anti-reflective patterns 135 may non-selectively combine with the first polymer block (e.g., PS) and the second polymer block (e.g., PMMA). The fixing patterns 145 may have a higher interfacial energy with respect to the first polymer block (e.g., PS) than the second polymer block (e.g., PMMA). In other words, the fixing patterns 145 may selectively combine with the first polymer block (e.g., PS). In this case, the fixing patterns 145 may comprise, for example, a polystyrene (PS) polymer.

Figure 5A:
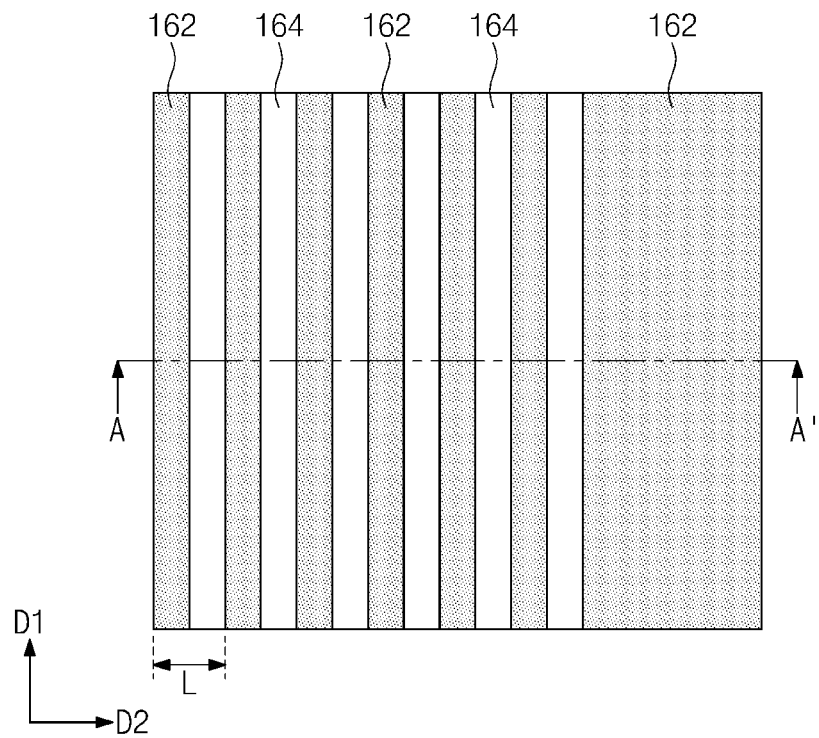
Figure 5B:
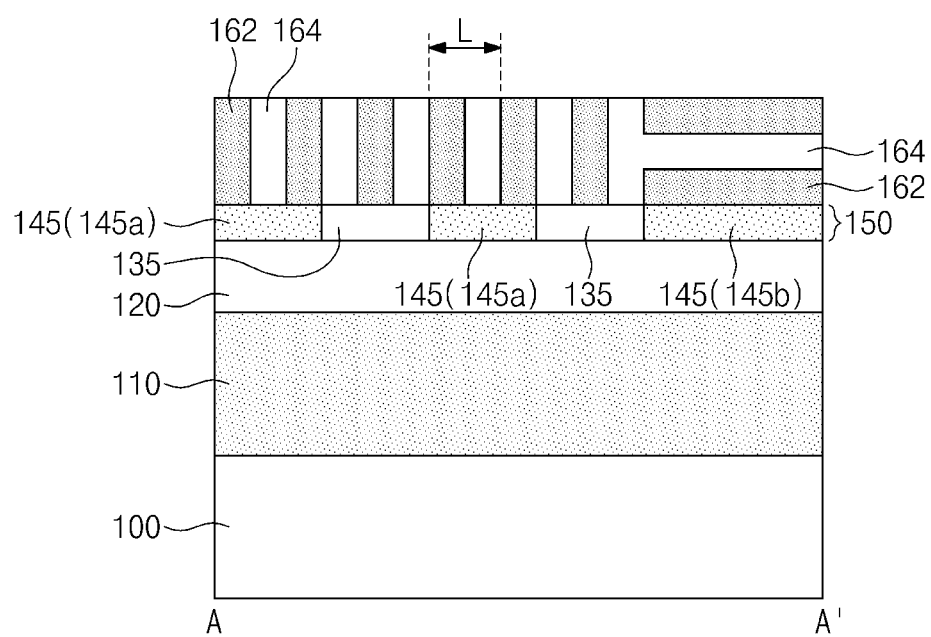

Referring to FIGS. 5A and 5B, the block copolymer layer 160 may be phase-separated to form first patterns 162 and second patterns 164 on the self-assemble guide layer 150. The block copolymer layer 160 may be phase-separated by an annealing process, and the annealing process may be performed under a temperature higher than a glass transition temperature Tg of the block copolymer layer 160. For example, the annealing process may be performed under a temperature of about 200° C. to about 300° C. In some examples, the first polymer block and the second polymer block may have a volume ratio of about 1:1 in the block copolymer layer 160. The block copolymer layer 160 may therefore be phase-separated into a lamellar structure including the first and second polymer blocks that are alternately and repetitively disposed relative to one another. In this case, the pitch of the first polymer blocks may be uniform in the phase separation state. In other words, widths of the first and second polymer blocks may be uniform. Each width of the first and second polymer blocks may be the dimension thereof in a direction substantially the same as the direction in which the first and second polymer blocks are disposed relative to one another.

Each of the first patterns 162 may comprise the first polymer block, and each of the second patterns 164 may comprise the second polymer block. The first patterns 162 and the second patterns 164 may each have a linear shape and extend longitudinally in the first direction D1. The first patterns 162 and the second patterns 164 may be alternately and repetitively arranged in the second direction D2 on the anti-reflective patterns 135 and the narrow fixing patterns 145*a*. The first patterns 162 and the second patterns 164 may be disposed on the wide fixing pattern 145*b* and may be alternately and repetitively stacked in a direction substantially perpendicular to the top surface of the etching target layer 100. Because the block copolymer layer 160 is phase-separated into the lamellar structure, the pitch L of the first patterns 162 may be uniform. In some examples, the width 135W of each of the anti-reflective patterns 135 may be 1.5 times the pitch L of the first patterns 162 (i.e., 135W=1.5L). The width 145W of each of the narrow fixing patterns 145*a* may be 1.5 times the pitch L of the first patterns 162 (i.e., 145W=1.5L).

Because the fixing patterns 145 have a higher interfacial energy with respect to the first polymer block than the second polymer block, the first patterns 162 may be fixed on the fixing patterns 145. Because the narrow fixing patterns 145a and the anti-reflective patterns 135 are alternatively and repetitively arranged in the second direction D2 with a predetermined width, the first patterns 162 may be fixed to be stacked in the second direction D2 on the narrow fixing patterns 145a. In this case, a plurality of the first patterns 162 may be fixed on each of the narrow fixing patterns 145a, and at least one second pattern 164 interposed between the plurality of the first patterns 162 may be disposed on each of the narrow fixing patterns 145a. In other words, the number of the first patterns 162 fixed on each of the narrow fixing patterns 145a may be n, and the number of the second patterns 164 disposed on each of the narrow fixing patterns 145a may be n-1 (wherein n is an integer of 2 or more). When the width 145W of each of the narrow fixing patterns 145a is 1.5 times the pitch L of the first patterns 162 (i.e., 145W=1.5L), as shown in the figures, two first patterns 162 may be fixed on each of the narrow fixing patterns 145a and a single second pattern 164 may be disposed on each of the narrow fixing patterns 145a. Because the wide fixing pattern 145b has a relatively great width, one of the first patterns 162 may be fixed on the wide fixing pattern 145b and the first and second patterns 162 and 164 may be alternately stacked on the first pattern 162 fixed on the wide fixing pattern 145b.

Because the anti-reflective layer 130 has a non-selective neutral interfacial energy with respect to the first and second polymer blocks, the first and second patterns 162 and 164 may be alternately disposed in the second direction D2 on each of the anti-reflective patterns 135. In some examples, a ratio of the width 135W of each of the anti-reflective patterns 135 to the width 145W of each of the narrow fixing patterns 145a may be about 1:1, and thus the total number of the first and second patterns 162 and 164 on each of the anti-reflective patterns 135 may be substantially the same as the total number of the first and second patterns 162 and 164 on each of the narrow fixing patterns 145a. In this case, the number of the first patterns 162 on each of the anti-reflective patterns 135 may be n-1, and the number of the second patterns 164 on each of the anti-reflective patterns 135 may be n (wherein n is an integer of 2 or more).

Figure 6A:
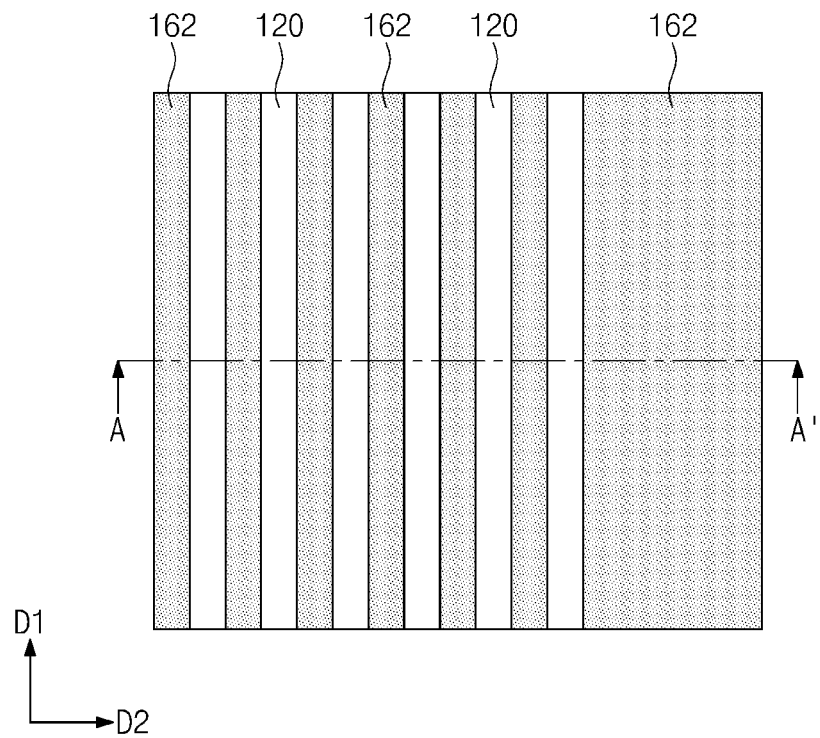
Figure 6B:
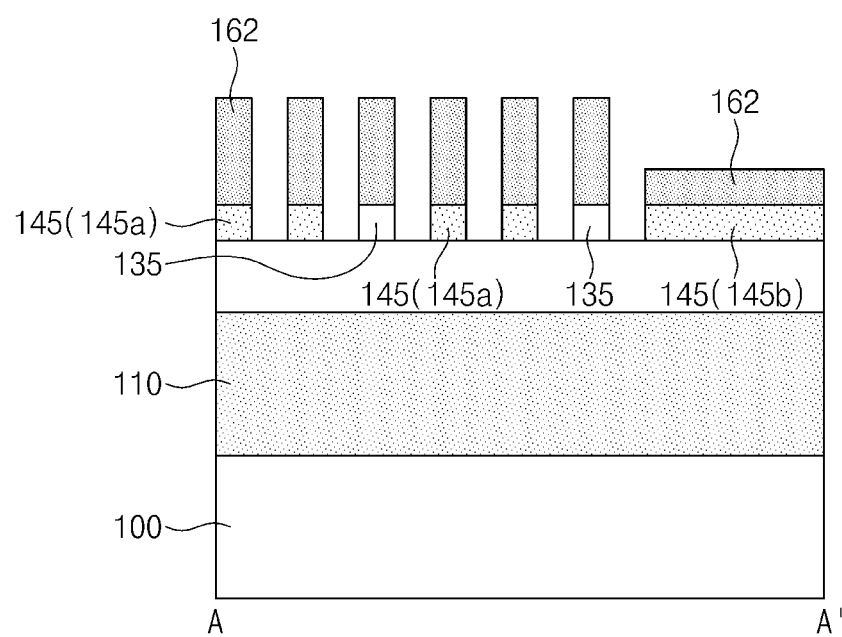

Referring to FIGS. 6A and 6B, the second patterns 164 may be selectively removed. The removing of the second patterns 164 may comprise performing a dry etch process using, for example, oxygen ($O_2$) or the like, and alternatively comprises irradiating the lamellar structure with ultraviolet rays and performing a development process using an organic solvent (e.g., IPA). The removing of the second patterns 164 may comprise etching the anti-reflective patterns 135 and the fixing patterns 145 (i.e., the narrow fixing patterns 145a) under the second patterns 164 so as to expose the top surface of the upper mask layer 120.

Figure 7A:
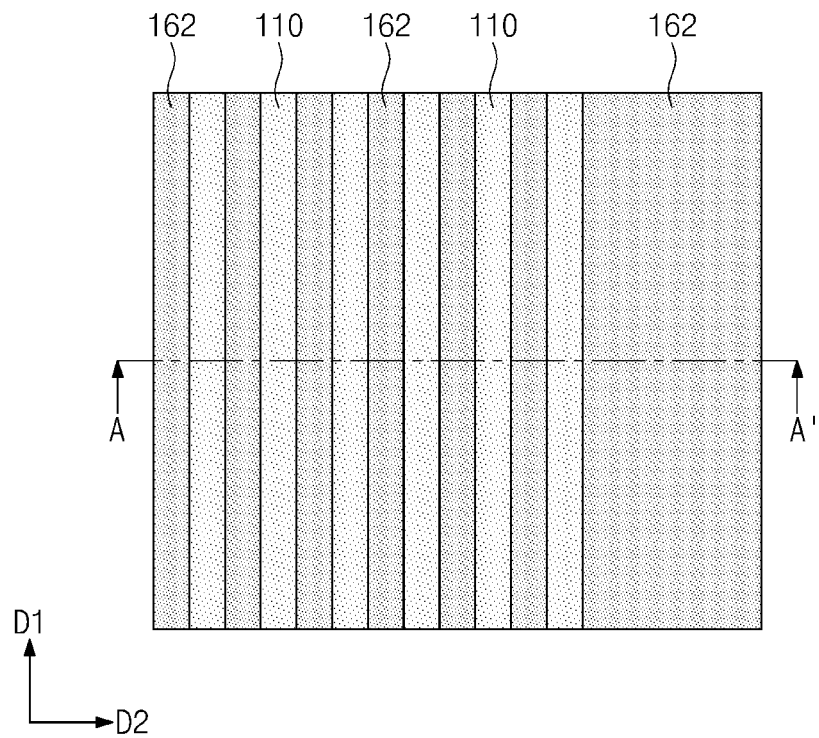
Figure 7B:
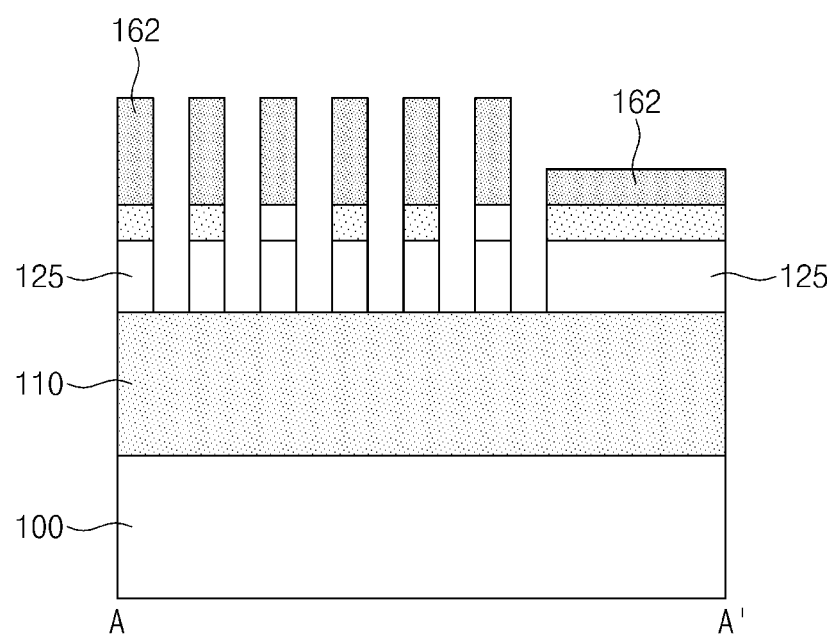

Referring to FIGS. 7A and 7B, after the second patterns 164 are removed, the upper mask layer 120 may be etched using the first patterns 162 as an etch mask to form upper mask patterns 125. The etch process may expose a top surface of the lower mask layer 110 between the upper mask patterns 125.

Figure 8A:
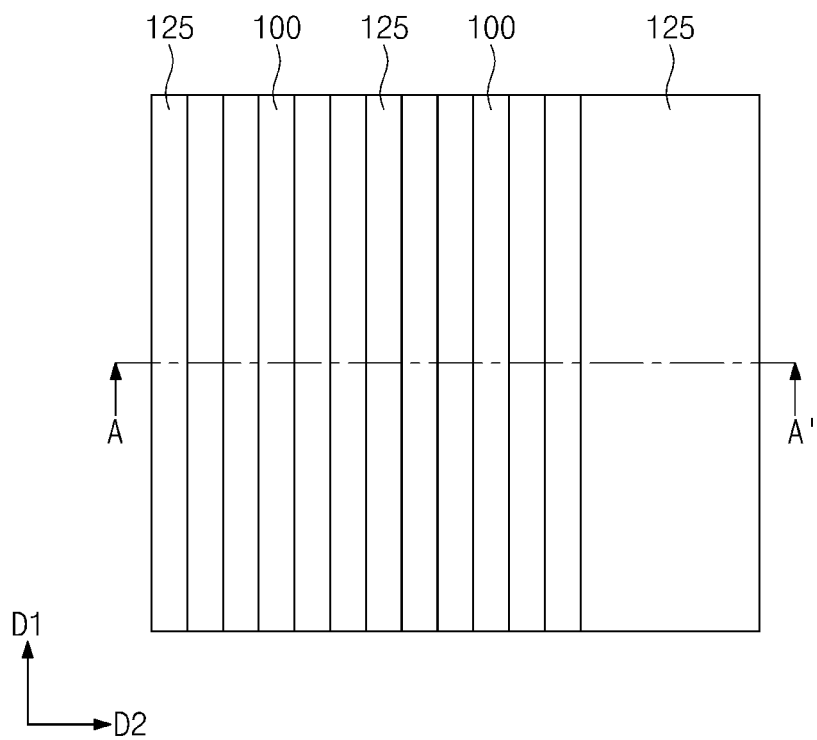
Figure 8B:
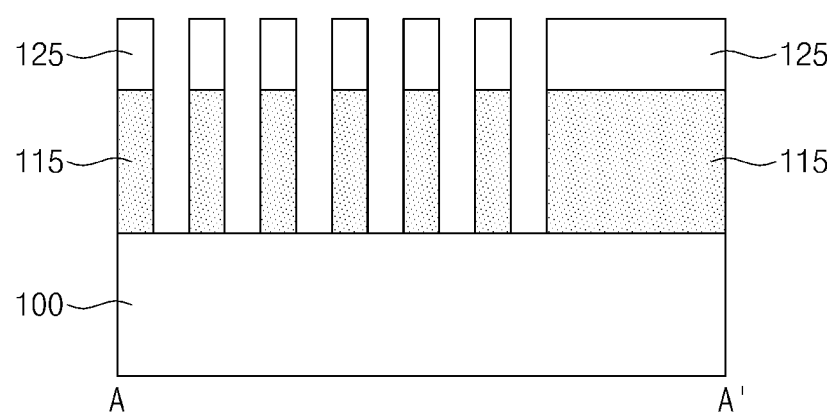

Referring to FIGS. 8A and 8B, the lower mask layer 110 may be etched using the upper mask patterns 125 as an etch mask to form lower mask patterns 115. The first patterns 162 and remaining portions of the self-assemble guide layer 150 under the first patterns 162 may be removed before or during the etch process for removing portions of the lower mask layer 110. The etch process for removing the portions of the lower mask layer 110 may expose the top surface of the etching target layer 100 between the lower mask patterns 115.

Figure 9A:
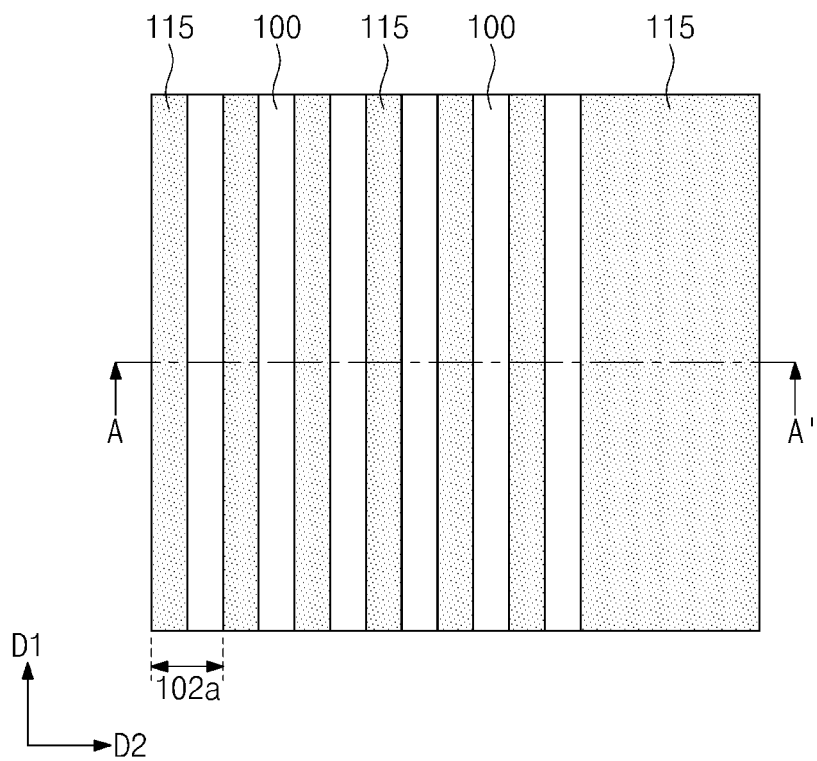
Figure 9B:
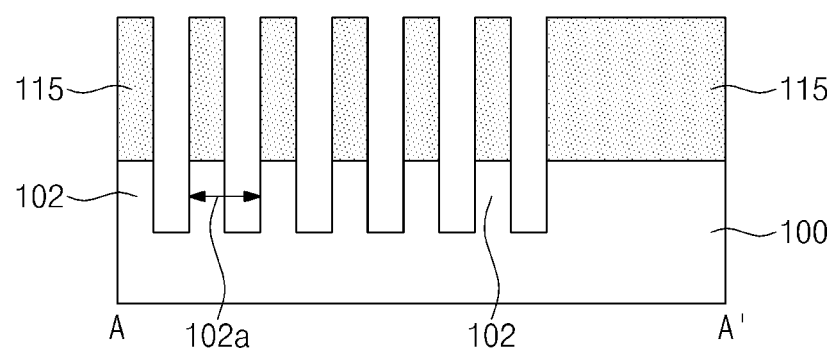

Referring to FIGS. 9A and 9B, the etching target layer 100 may be patterned using the lower mask patterns 115 as an etch mask. The upper mask patterns 125 may be removed before or during the patterning process. Because the etching target layer 100 is patterned using the lower mask patterns 115 as an etch mask, line patterns 102 may be formed in an upper portion of the etching target layer 100. Each of the line patterns 102 may extend longitudinally in the first direction D1 and may be spaced apart from each other in the second direction D2. A pitch 102a of the line patterns 102 may be substantially the same as the pitch L of the first patterns 162 as described with reference to FIGS. 5A and 5B. In other words, the pitch L of the first patterns 162 may be transferred to the line patterns 102 through the etch processes respectively using the first patterns 162, the upper mask patterns 125, and the lower mask patterns 115.

According to the present inventive concept, the self-assemble guide layer 150 may be formed using the anti-reflective layer 130 having a non-selective neutral interfacial energy with respect to the first and second polymer blocks and the fixing patterns 145 having a relatively high interfacial energy with respect to the first polymer block. The block copolymer layer 160 may then be phase-separated and the self-assemble guide layer 150 may allow the phase-separated block copolymer layer 160 to be self-assembled, thereby forming fine patterns with a fine pitch. Moreover, the upper mask layer 120 including an inorganic compound may be provided as interposed between the self-assemble guide layer 150 and the lower mask layer 110 which includes an organic compound. When ashing and/or strip processes is/are performed to form again patterns on the upper mask layer 120, the upper mask layer 120 may protect the lower mask layer 110 during the ashing and/or strip processes. As a result, it may be possible to easily perform a rework for forming again patterns on the upper mask layer 120.

It therefore may be possible to easily form fine patterns and to easily perform a rework. Accordingly, a method of forming fine patterns according to the inventive concept is capable of reducing the cost of fabricating a semiconductor device.

FIGS. 10A through 13B illustrate other examples of a method of forming fine patterns according to the present inventive concept. In the description that follows, elements identical to those shown in FIGS. 1A through 9A and 1B through 9B may be designated by the same reference numerals and duplicate descriptions thereof may be omitted for the sake of brevity.

Figure 10A:
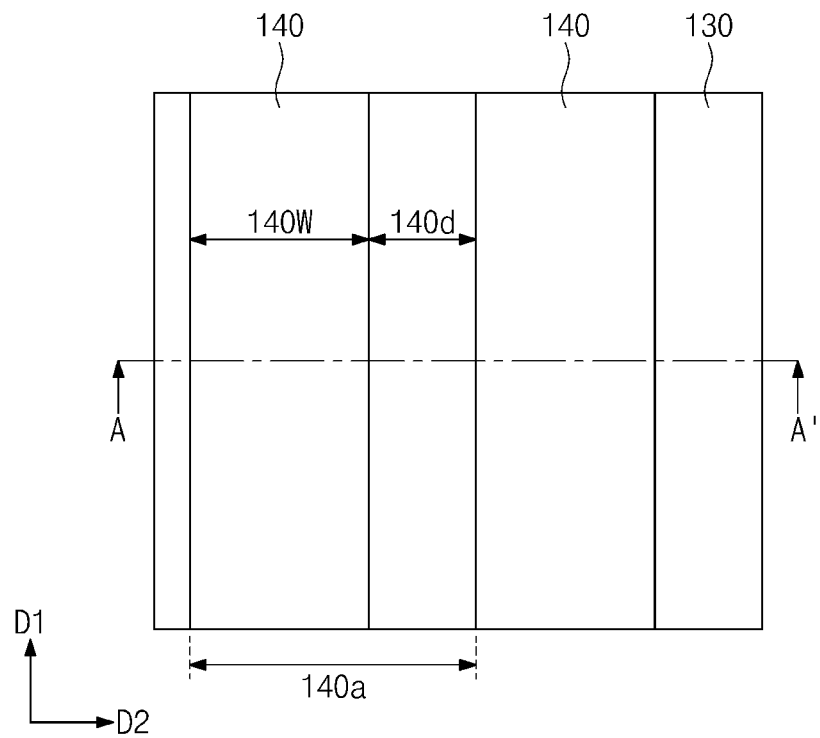
FIGS. 10A, 11A, 12A and 13A are plan views of a structure of a semiconductor device during the course of its manufacture and together illustrate examples of a method of forming fine patterns according to the present inventive concept.
Figure 10B:
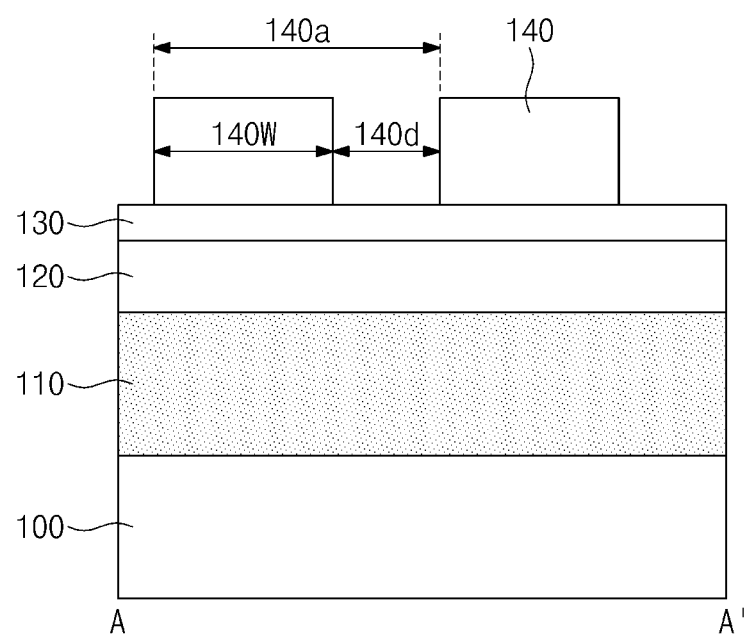
FIGS. 10B, 11B, 12B and 13B are cross-sectional view taken long line A-A' of FIGS. 10A through 13A, respectively.

Referring to FIGS. 10A and 10B, a lower mask layer 110 and an upper mask layer 120 may be sequentially stacked on an etching target layer 100, and an anti-reflective layer 130 may be formed on the upper mask layer 120. Photoresist patterns 140 may be formed on the anti-reflective layer 130. A pitch 140a of the photoresist patterns 140 may be a sum of a width 140W of a single photoresist pattern 140 in the second direction D2 and a distance 140d between the adjacent photoresist patterns 140 in the second direction D2. In some examples, a ratio of the width 140W to the distance 140d may be about 5:3.

Figure 11A:
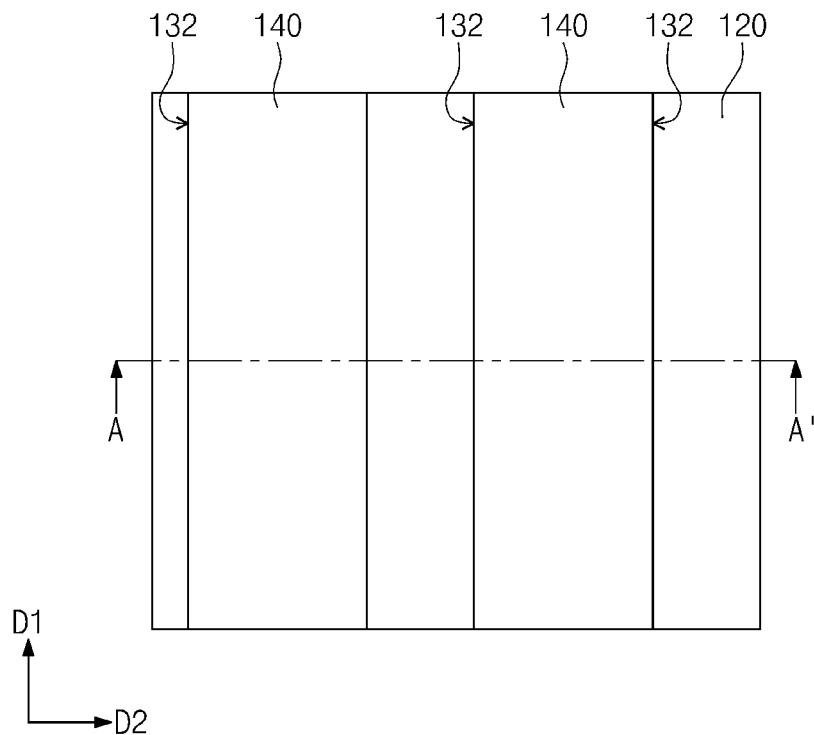
Figure 11B:
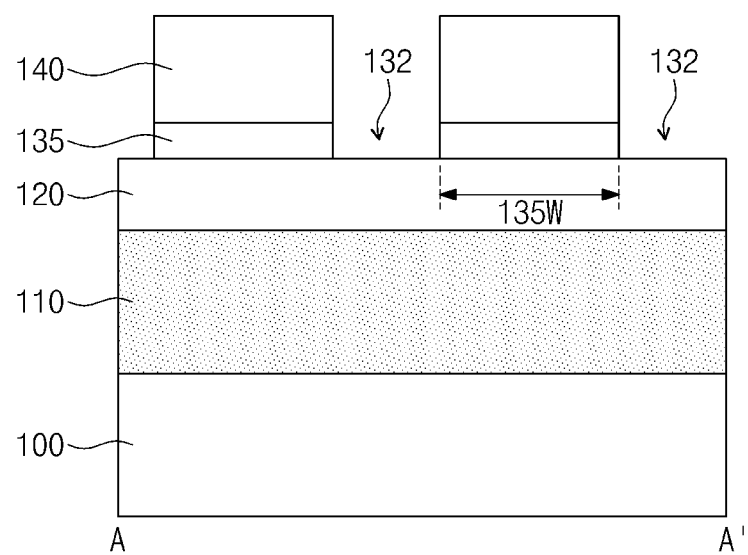

Referring to FIGS. 11A and 11B, the anti-reflective layer 130 may be etched using the photoresist patterns 140 as an etch mask to form openings 132 which expose a top surface of the upper mask layer 120. The openings 132 may divide the anti-reflective layer 130 into anti-reflective patterns 135. A width 135W of each of the anti-reflective patterns 135 may be substantially the same as a width 140W of each of the photoresist patterns 140.

Figure 12A:
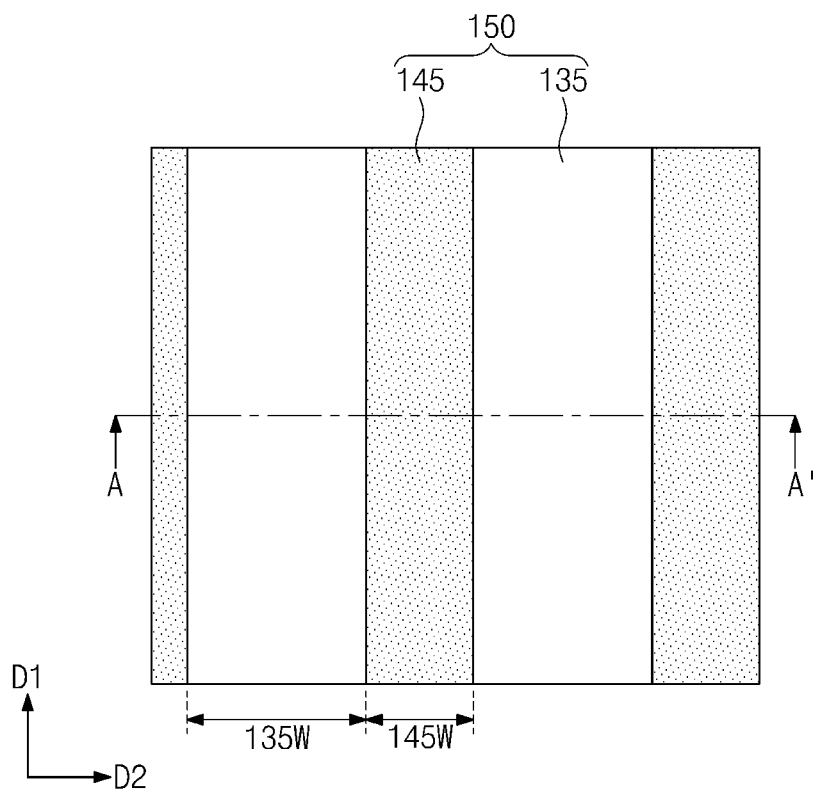
Figure 12B:
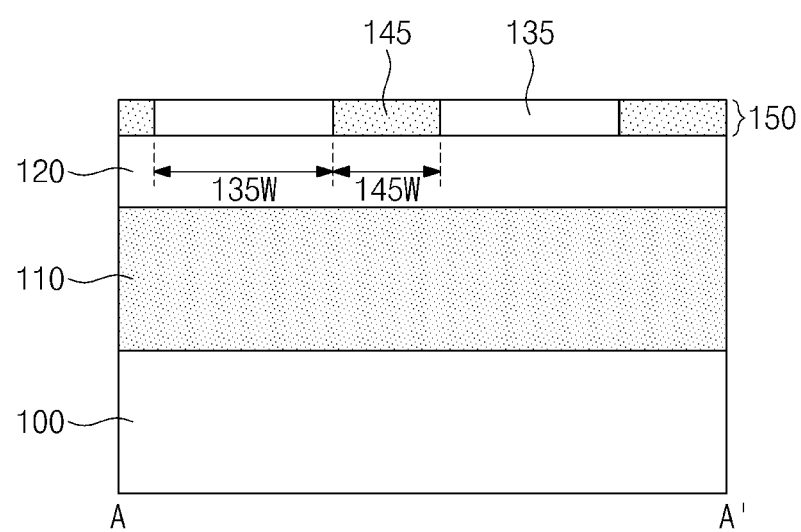

Referring to FIGS. 12A and 12B, fixing patterns 145 may be formed in the openings 132. In some examples, the fixing patterns 145 may correspond to the narrow fixing patterns 145a described with reference to FIGS. 3A and 3B. The anti-reflective patterns 135 and the fixing patterns 145 may be alternately and repetitively disposed in the second direction D2. The anti-reflective patterns 135 and the fixing patterns 145 may have bottom surfaces in contact with the top surface of the upper mask layer 120.

Each of the fixing patterns 145 may have the width 145W in the second direction D2. The width 145W of each of the fixing patterns 145 may be substantially the same as the distance 140d between the photoresist patterns 140. In other words, the pitch 140a of the photoresist patterns 140 may be substantially the same as a sum of the width 135W of each of the anti-reflective patterns 135 and the width 145W of each of the fixing patterns 145. In some examples, a ratio of the width 135W of each of the anti-reflective patterns 135 to the width 145W of each of the fixing patterns 145 may be about 5:3.

The anti-reflective patterns 135 and the fixing patterns 145 may define a self-assemble guide layer 150. A block copolymer layer 160 may be formed on the self-assemble guide layer 150, as described with reference to FIGS. 4A and 4B. The block copolymer layer 160 may comprise a block copolymer that includes first and second polymer blocks which are different from each other and are linked to each other through a covalent bond.

Figure 13A:
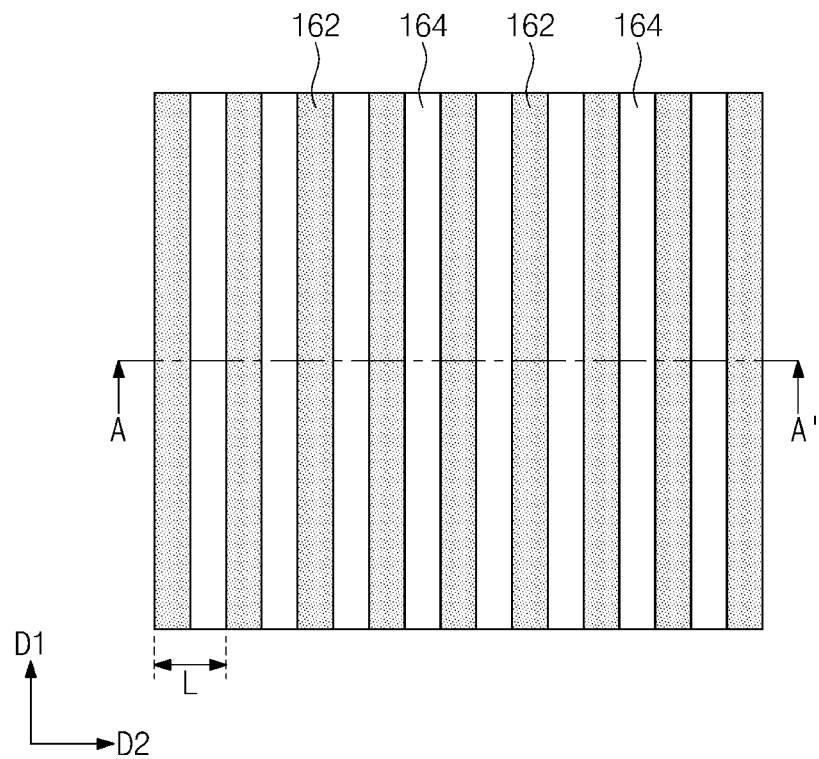
Figure 13B:
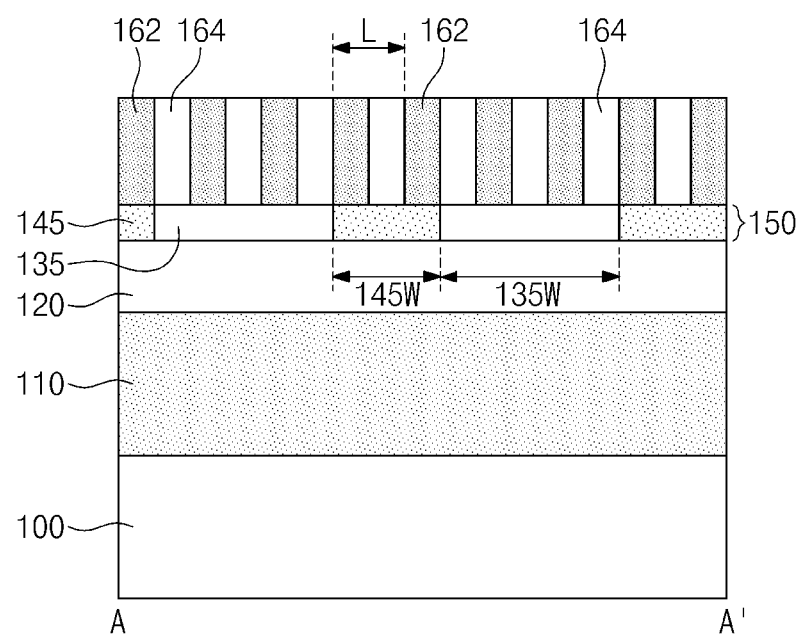

Referring to FIGS. 13A and 13B, the block copolymer layer 160 may be phase-separated to form first patterns 162 and second patterns 164 on the self-assemble guide layer 150. The first polymer block and the second polymer block may have a volume ratio of about 1:1 in the block copolymer layer 160, and thus, the block copolymer layer 160 may be phase-separated into a lamellar structure including the first and second polymer blocks that are alternately and repetitively disposed relative to one another. In this case, the pitch of the first polymer blocks may be uniform in the phase separation state.

Each of the first patterns 162 may comprise the first polymer block, and each of the second patterns 164 may comprise the second polymer block. That is, the pitch L of the first patterns 162 may be uniform. In some examples, the width 135W of each of the anti-reflective patterns 135 may be 2.5 times the pitch L of the first patterns 162 (i.e., 135W=2.5L), and the width 145W of each of the fixing patterns 145 may be 1.5 times the pitch L of the first patterns 162 (i.e., 145W=1.5L). In this case, the number of the first patterns 162 fixed on each of the fixing patterns 145 may be n, and the number of the second patterns 164 disposed on each of the fixing patterns 145 may be n−1 (wherein n is an integer of 2 or more). When the width 145W of each of the fixing patterns 145 is 1.5 times the pitch L of the first patterns 162 (i.e., 145W=1.5L), as shown in figures, two first patterns 162 may be fixed on each of the fixing patterns 145 and a single second pattern 164 may be disposed on each of the fixing patterns 145.

Because the anti-reflective layer 130 has a non-selective neutral interfacial energy with respect to the first and second polymer blocks, the first and second patterns 162 and 164 may be alternately disposed in the second direction D2 on each of the anti-reflective patterns 135. In some examples, a ratio of the width 135W of each of the anti-reflective patterns 135 to the width 145W of each of the fixing patterns 145 may be about 5:3, and thus a ratio of the total number of the first and second patterns 162 and 164 on each of the anti-reflective patterns 135 to the total number of the first and second patterns 162 and 164 on each of the fixing patterns 145 may be about 5:3. In this case, the number of the first patterns 162 on each of the anti-reflective patterns 135 may be n, and the number of the second patterns 164 on each of the anti-reflective patterns 135 may be n+1 (wherein n is an integer of 2 or more).

Subsequent processes may be substantially the same as those described with reference to FIGS. 6A through 9A and 6B through 9B.

FIGS. 14A through 17B illustrate further examples of a method of forming fine patterns according to the present inventive concept. In the description that follows, elements identical to those shown in FIGS. 1A through 9A and 1B through 9B may be designated by the same reference numerals and duplicate descriptions thereof may be omitted for the sake of brevity.

Figure 14A:
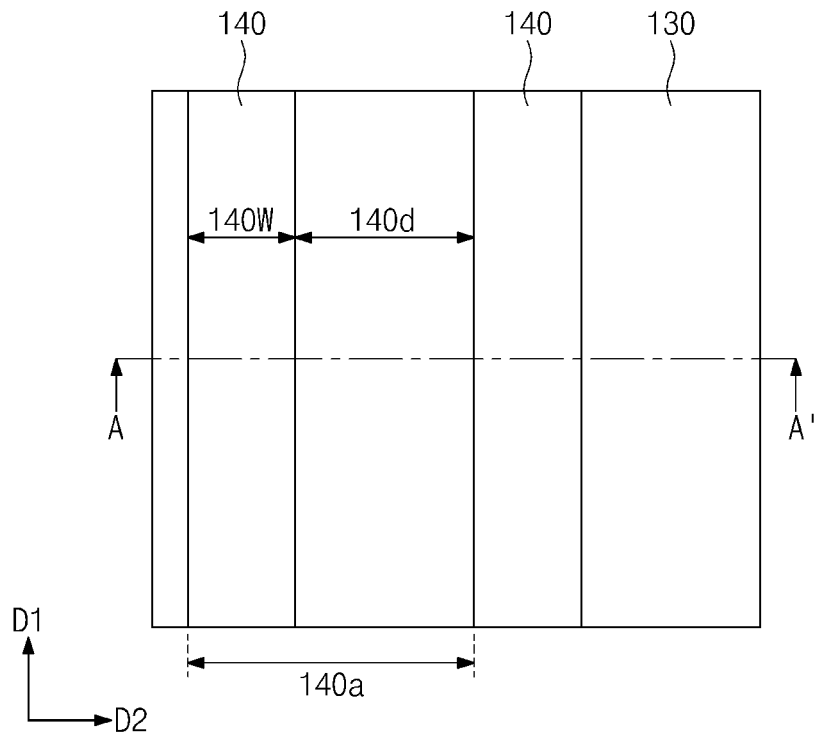
FIGS. 14A, 15A, 16A and 17A are plan views of a structure of a semiconductor device during the course of its manufacture and together illustrate examples of a method of forming fine patterns according to the present inventive concept.
Figure 14B:
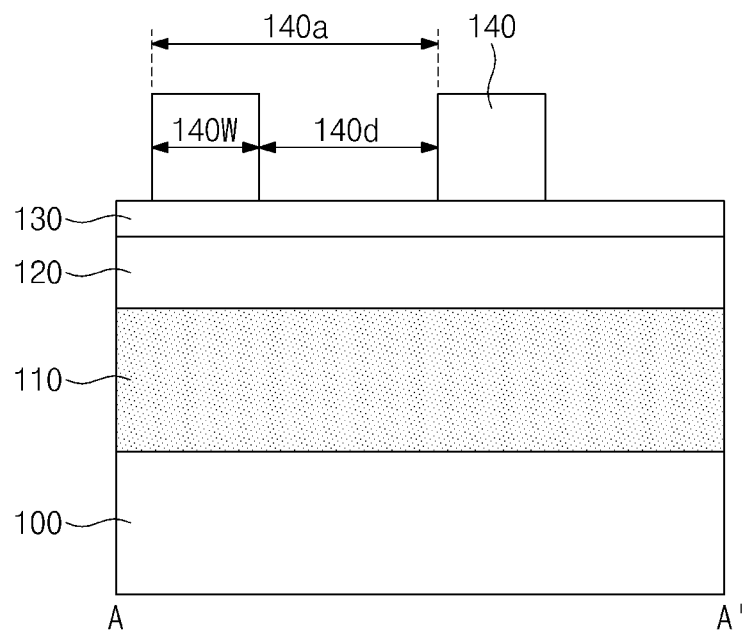
FIGS. 14B, 15B, 16B and 17B are cross-sectional view taken long line A-A' of FIGS. 14A through 17A, respectively.

Referring to FIGS. 14A and 14B, a lower mask layer 110 and an upper mask layer 120 may be sequentially stacked on an etching target layer 100, and an anti-reflective layer 130 may be formed on the upper mask layer 120. Photoresist patterns 140 may be formed on the anti-reflective layer 130. A pitch 140a of the photoresist patterns 140 may be a sum of a width 140W of a single photoresist pattern 140 in the second direction D2 and a distance 140d between adjacent photoresist patterns 140 in the second direction D2. In some examples, a ratio of the width 140W to the distance 140d may be about 3:5.

Figure 15A:
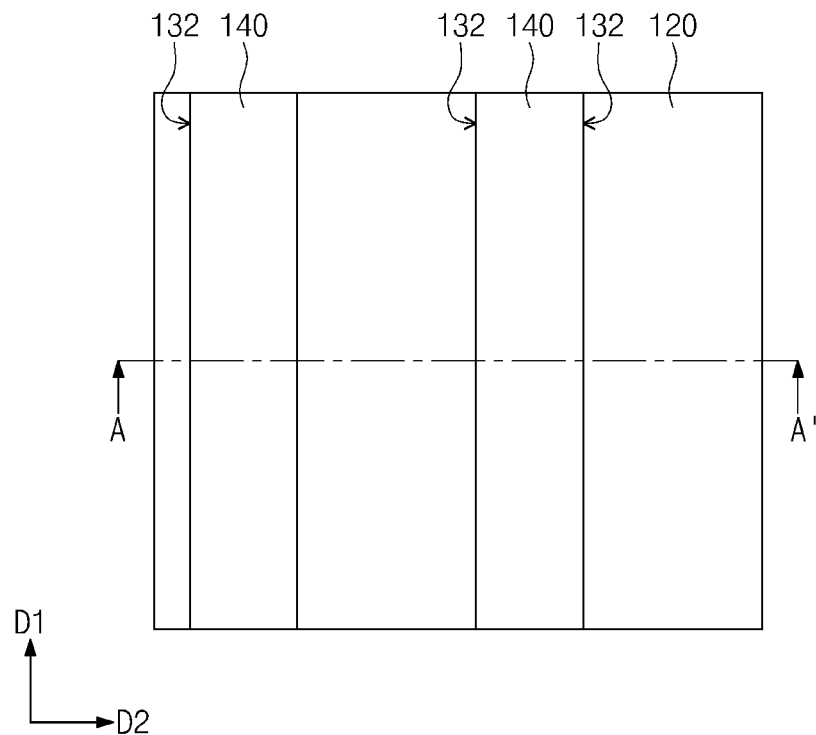
Figure 15B:
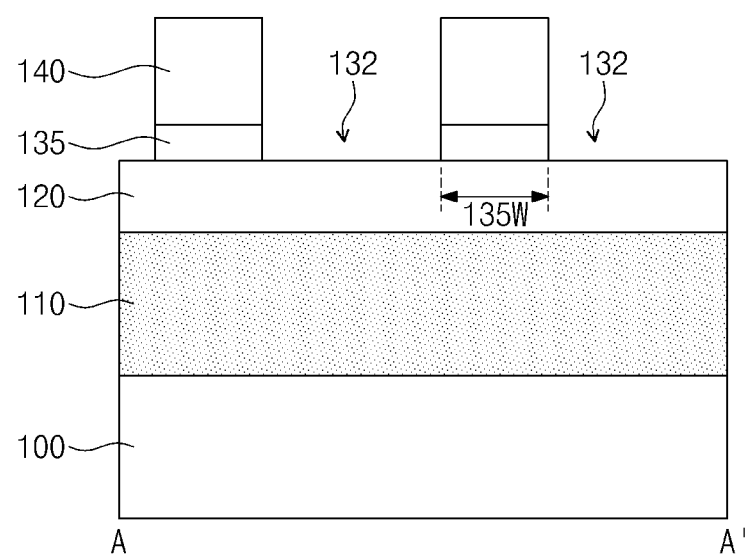

Referring to FIGS. 15A and 15B, the anti-reflective layer 130 may be etched using the photoresist patterns 140 as an etch mask to form openings 132 which expose a top surface of the upper mask layer 120. The openings 132 may divide the anti-reflective layer 130 into anti-reflective patterns 135. A width 135W of each of the anti-reflective patterns 135 may be substantially the same as a width 140W of each of the photoresist patterns 140.

Figure 16A:
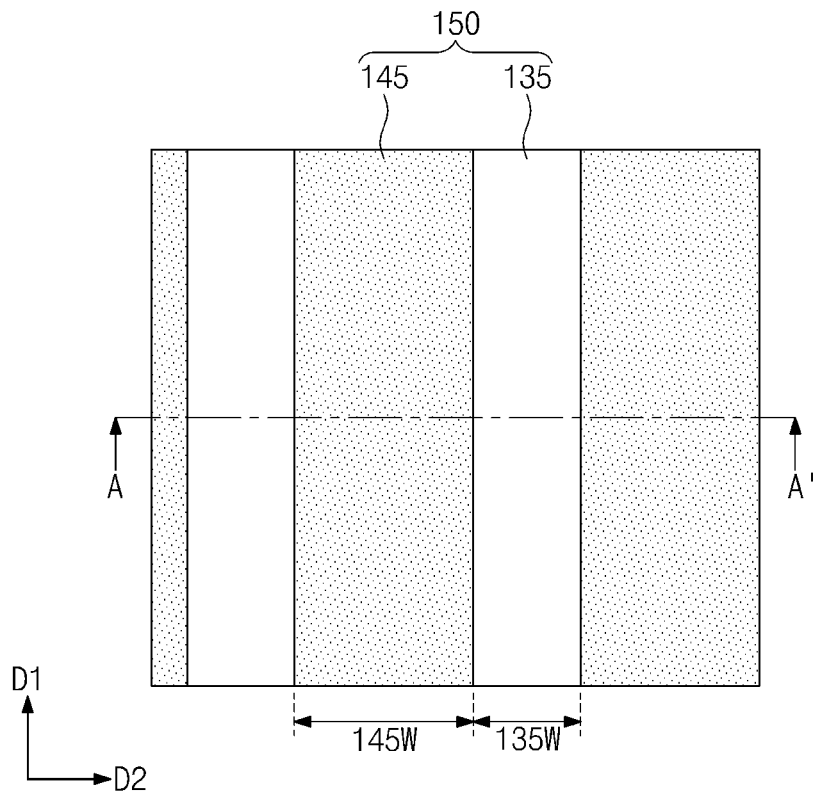
Figure 16B:
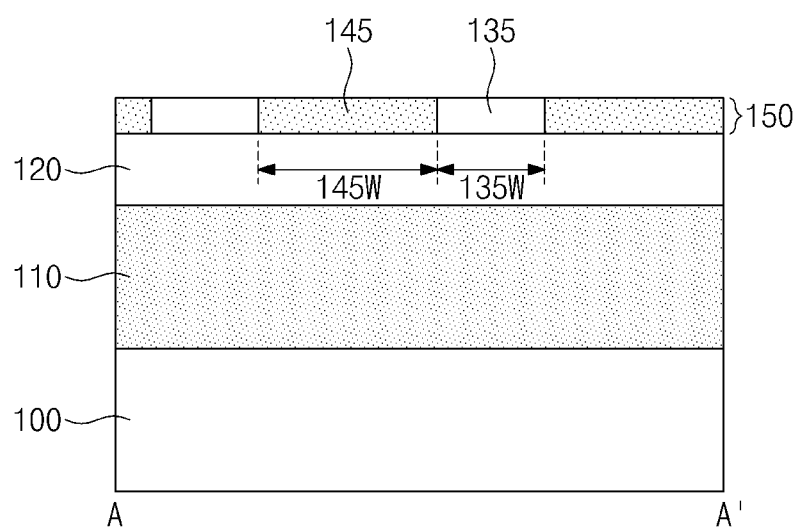

Referring to FIGS. 16A and 16B, fixing patterns 145 may be formed in the openings 132. In some examples, the fixing patterns 145 may correspond to the narrow fixing patterns 145a described with reference to FIGS. 3A and 3B. The anti-reflective patterns 135 and the fixing patterns 145 may be alternately and repetitively disposed in the second direction D2. The anti-reflective patterns 135 and the fixing patterns 145 may have bottom surfaces in contact with the top surface of the upper mask layer 120.

Each of the fixing patterns 145 may have a width 145W in the second direction D2. The width 145W of each of the fixing patterns 145 may be substantially the same as the distance 140d between the photoresist patterns 140. In other words, the pitch 140a of the photoresist patterns 140 may be substantially the same as a sum of the width 135W of each of the anti-reflective patterns 135 and the width 145W of each of the fixing patterns 145. In some examples, a ratio of the width 135W of each of the anti-reflective patterns 135 to the width 145W of each of the fixing patterns 145 may be about 3:5.

In other examples, though, in which the ratio of the width 140W of each of the photoresist patterns 140 to the distance 140d between the photoresist patterns 140 is about 5:3 as described with reference to FIGS. 10A and 10B, the width 135W of each of the anti-reflective patterns 135 may become less than the width 140W of each of the photoresist patterns 140 depending on a condition of the etch process for etching the anti-reflective layer 130 using the photoresist patterns 140 as an etch mask. In this case, as described with reference to FIGS. 16A and 16B, the pitch 140a of the photoresist patterns 140 may be substantially the same as a sum of the width 135W of each of the anti-reflective patterns 135 and the width 145W of each of the fixing patterns 145, and a ratio of the width 135W of each of the anti-reflective patterns 135 to the width 145W of each of the fixing patterns 145 may be about 3:5.

The anti-reflective patterns 135 and the fixing patterns 145 may define a self-assemble guide layer 150. A block copolymer layer 160 may be formed on the self-assemble guide layer 150, as described with reference to FIGS. 4A and 4B. The block copolymer layer 160 may comprise a block copolymer that includes first and second polymer blocks which are different from each other and are linked to each other through a covalent bond.

Figure 17A:
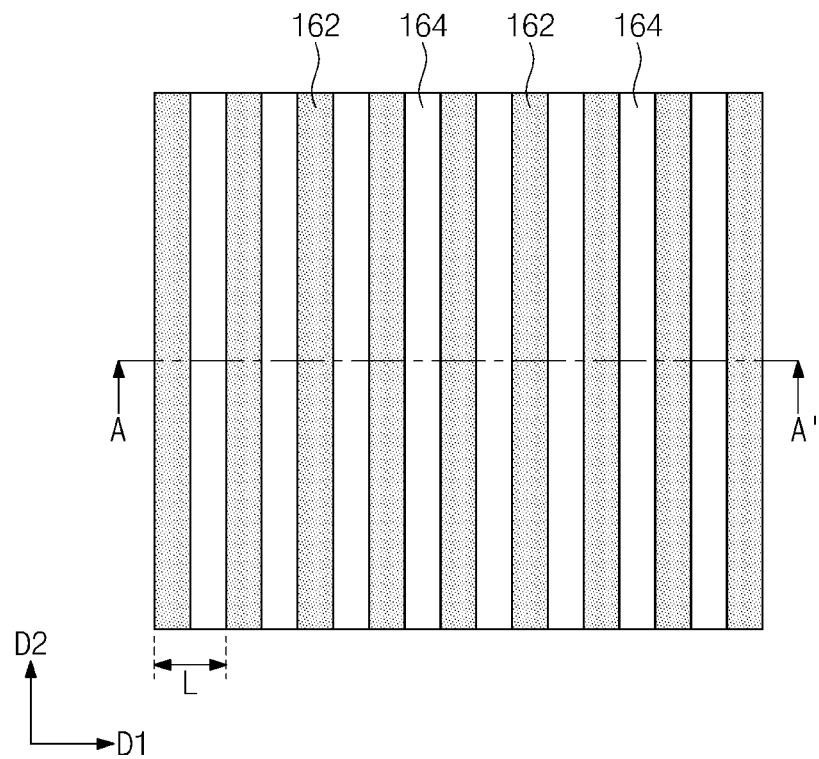
Figure 17B:
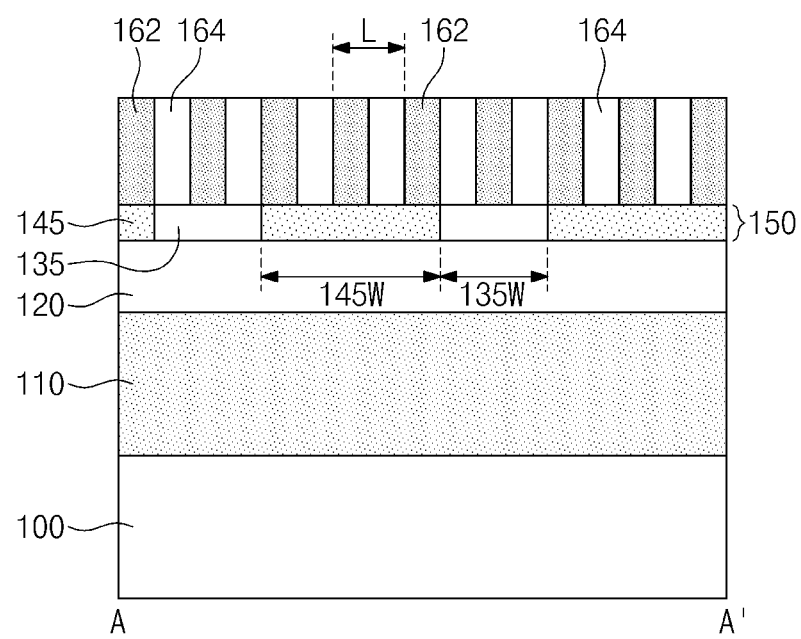

Referring to FIGS. 17A and 17B, the block copolymer layer 160 may be phase-separated to form first patterns 162 and second patterns 164 on the self-assemble guide layer 150. The first polymer block and the second polymer block may have a volume ratio of about 1:1 in the block copolymer layer 160, and thus, the block copolymer layer 160 may be phase-separated into a lamellar structure including the first and second polymer blocks that are alternately and repetitively disposed relative to one another. In this case, the pitch of the first polymer blocks may be uniform in the phase separation state.

Each of the first patterns 162 may comprise the first polymer block, and each of the second patterns 164 may comprise the second polymer block. That is, the pitch L of the first patterns 162 may be uniform. In some examples, the width 135W of each of the anti-reflective patterns 135 may be 1.5 times the pitch L of the first patterns 162 (i.e., 135W=1.5L), and the width 145W of each of the fixing patterns 145 may be 2.5 times the pitch L of the first patterns 162 (i.e., 145W=2.5L). In this case, the number of the first patterns 162 fixed on each of the fixing patterns 145 may be n+1, and the number of the second patterns 164 disposed on each of the fixing patterns 145 may be n (wherein n is an integer of 2 or more). When the width 145W of each of the fixing patterns 145 is 2.5 times the pitch L of the first patterns 162 (i.e., 145W=2.5L), as shown in FIG. 17B, three first patterns 162 may be fixed on each of the fixing patterns 145 and two second patterns 164 may be disposed on each of the fixing patterns 145.

Because the anti-reflective layer 130 has a non-selective neutral interfacial energy with respect to the first and second polymer blocks, the first and second patterns 162 and 164 may be alternately disposed in the second direction D2 on each of the anti-reflective patterns 135. In some examples, a ratio of the width 135W of each of the anti-reflective patterns 135 to the width 145W of each of the fixing patterns 145 may be about 3:5, and thus a ratio of the total number of the first and second patterns 162 and 164 on each of the anti-reflective patterns 135 to the total number of the first and second patterns 162 and 164 on each of the fixing patterns 145 may be about 3:5. In this case, the number of the first patterns 162 on each of the anti-reflective patterns 135 may be n−1, and the number of the second patterns 164 on each of the anti-reflective patterns 135 may be n (wherein n is an integer of 2 or more).

Subsequent processes may be substantially the same as those described with reference to FIGS. 6A through 9A and 6B through 9B.

FIGS. 18 through 21 are cross-sectional views, respectively corresponding to cross-sectional profiles taken along line A-A' of FIGS. 1A, 3A, 5A and 6A, and together illustrate other examples of a method of forming fine patterns according to the present inventive concept. In the description that follows, elements identical to those shown in FIGS. 1A through 9A and 1B through 9B may be designated by the same reference numerals and duplicate descriptions thereof may be omitted for the sake of brevity.

Figure 18:
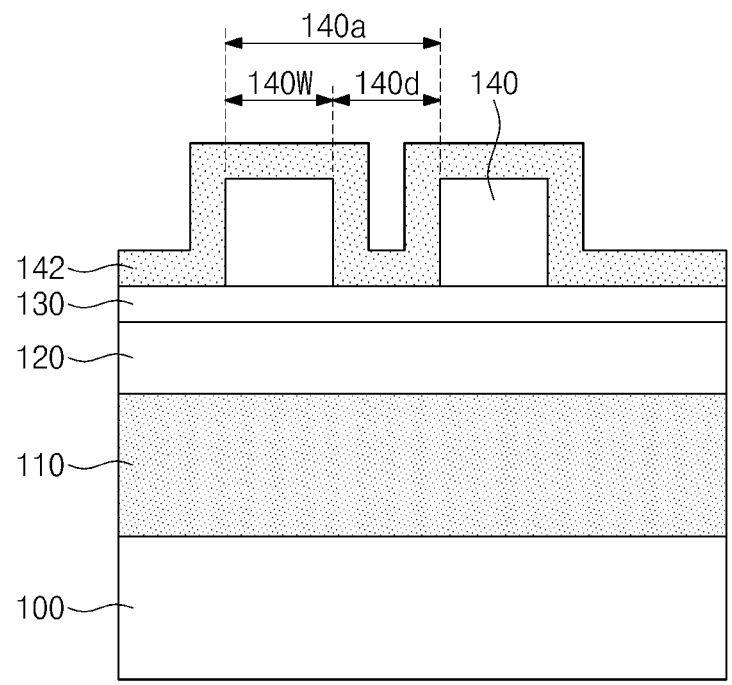
FIGS. 18, 19, 20 and 21 are cross-sectional views, respectively corresponding to cross-sectional profiles taken along line A-A' of FIGS. 1A, 3A, 5A and 6A, illustrating examples of a method of forming fine patterns according to the present inventive concept.

Referring to FIGS. 1A and 18, a lower mask layer 110 and an upper mask layer 120 may be sequentially stacked on an etching target layer 100, and an anti-reflective layer 130 may be formed on the upper mask layer 120. For example, the anti-reflective layer 130 may comprise an organic ARC (anti-reflective coating) material. In some examples, the anti-reflective layer 130 may comprise a functional group which can react with a polymer layer which is described later. In this respect, the anti-reflective layer 130 may comprise at least one of, for example, a hydroxyl (—OH) group and a carboxyl (—COOH) group. The anti-reflective layer 130 may control reflectivity of light used in a photolithography process, and may have a neutral interfacial energy with respect to polymer blocks constituting a block copolymer which is described below. In particular, the block copolymer may comprise a first polymer block and a second polymer block that are different from each other, and the anti-reflective layer 130 may have a non-selective neutral interfacial energy with respect to the first and second polymer blocks. In other words, the anti-reflective layer 130 may non-selectively combine with the first and second polymer blocks.

Photoresist patterns 140 may be formed on the anti-reflective layer 130. A pitch 140a of the photoresist patterns 140 may be a sum of a width 140W of the photoresist pattern 140 in the second direction D2 and a distance 140d between the adjacent photoresist patterns 140 in the second direction D2. A ratio of the width 140W to the distance 140d may be about 1:1. In some examples, the photoresist patterns 140 may comprise a negative resist composition used in a negative-tone development (NTD) process.

A polymer layer 142 may be formed on the anti-reflective layer 130 on which the photoresist patterns 140 are formed. The polymer layer 142 may cover the photoresist patterns 140 and further cover a top surface of the anti-reflective layer 130 between the photoresist patterns 140. The polymer layer 142 may comprise a polymer substantially the same as the first polymer block, and the polymer may include a functional group, which can be covalently bonded with a functional group (e.g., a hydroxyl (—OH) group or a carboxyl (—COOH) group) of the anti-reflective layer 130, at its end or backbone. The polymer may comprise at least one of, for example, a hydroxyl (—OH) group and a carboxyl (—COOH) group. The polymer layer 142 may be formed by a coating process.

Figure 19:
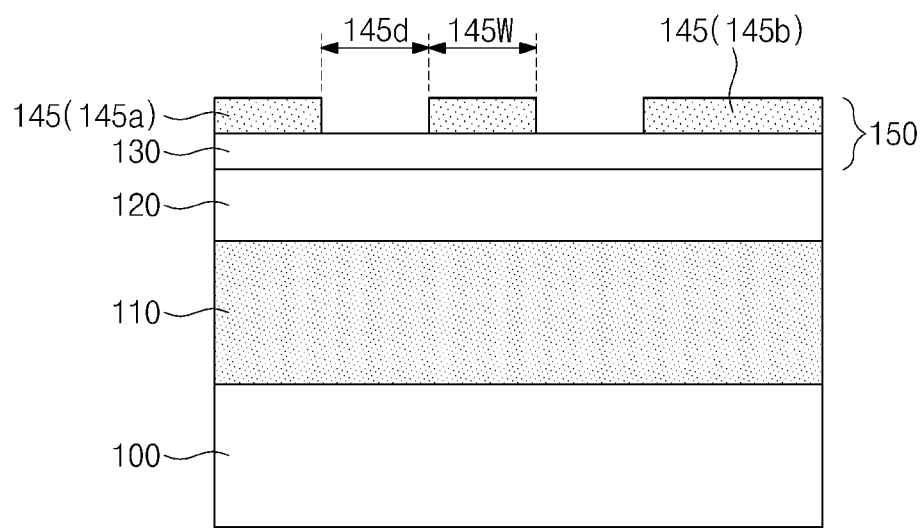

Referring to FIGS. 3A and 19, the polymer layer 142 may be used to form, on the anti-reflective layer 130, fixing patterns 145 that are spaced apart from each other in the second direction D2. Because the fixing patterns 145 are formed to be spaced apart from each other in the second direction D2, the top surface of the anti-reflective layer 130 may be partially exposed at between the fixing patterns 145. In some examples, the fixing patterns 145 may be spaced apart from the upper mask layer 120 with the anti-reflective layer 130 interposed therebetween. The fixing patterns 145 may have top surfaces higher than that of the anti-reflective layer 130.

Each of the fixing patterns 145 may have a width in the second direction D2. The fixing patterns 145 may comprise narrow fixing patterns 145a having a relatively small width and a wide fixing pattern 145b having a relatively great width. In some examples, each of the narrow fixing patterns 145a may have a width 145W substantially the same as the distance 140d between the photoresist patterns 140, and a distance 145d in the second direction D2 between the fixing patterns 145 may be substantially the same as the width 140W of each of the photoresist patterns 140. In other words, the pitch 140a of the photoresist patterns 140 may be substantially the same as a sum of the width 145W of each of the narrow fixing patterns 145a and the distance 145d between the fixing patterns 145. In some examples, a ratio of the width 145W of each of the narrow fixing patterns 145a to the distance 145d between the fixing patterns 145 may be about 1:1. The wide fixing pattern 145b may have a width greater than the width 145W of each of the narrow fixing patterns 145a.

The fixing patterns 145 may have a high interfacial energy with respect to one of polymer blocks constituting a block copolymer which is described below. Specifically, the block copolymer may comprise a first polymer block and a second polymer block that are different from each other, and the fixing patterns 145 may have a higher interfacial energy with respect to the first polymer block than the second polymer block. In other words, the fixing patterns 145 may selectively combine with the first polymer block. The fixing patterns 145 may comprise a polymer substantially the same as that of the first polymer block.

The forming of the fixing patterns 145 may comprise reacting the polymer layer 142 with the photoresist patterns 140 and the anti-reflective layer 130, removing a non-reacted portion of the polymer layer 142 (i.e., the portion which is not reacted with the photoresist patterns 140 and the anti-reflective layer 130), and removing the photoresist patterns 140. For example, a bake process may be employed to react the polymer layer 142 with the photoresist patterns 140 and the anti-reflective layer 130. In this case, the functional group of the polymer layer 142 may be covalently bonded with the functional group of the anti-reflective layer 130, and thus the polymer layer 142 may be attached to the top surface of the anti-reflective layer 130. An organic solvent (e.g., PGMEA (propylene glycol methyl ether acetate) or the like) may be used to remove the non-reacted portion of the polymer layer 142 which is not reacted with the photoresist patterns 140 and the anti-reflective layer 130. Subsequently, the photoresist patterns 140 may be removed, optionally with a portion of the polymer layer 142 which is attached thereto. Therefore, the polymer layer 142 may partially remain on the top surface of the anti-reflective layer 130, and a remaining portion of the polymer layer 142 may constitute the fixing patterns 145.

The anti-reflective layer 130 and the fixing patterns 145 may define a self-assemble guide layer 150. That is, in this case, the anti-reflective layer 130 remains, i.e., as un-reacted, at least in the regions that were below the photoresist patterns 140 and the top surface of the anti-reflective layer 130 is exposed at regions between the fixing patterns 145. A block copolymer layer 160 may be formed on the self-assemble guide layer 150, as described with reference to FIGS. 4A and 4B. The block copolymer layer 160 may comprise a block copolymer that includes first and second polymer blocks which are different from each other and are linked to each other through a covalent bond.

Figure 20:
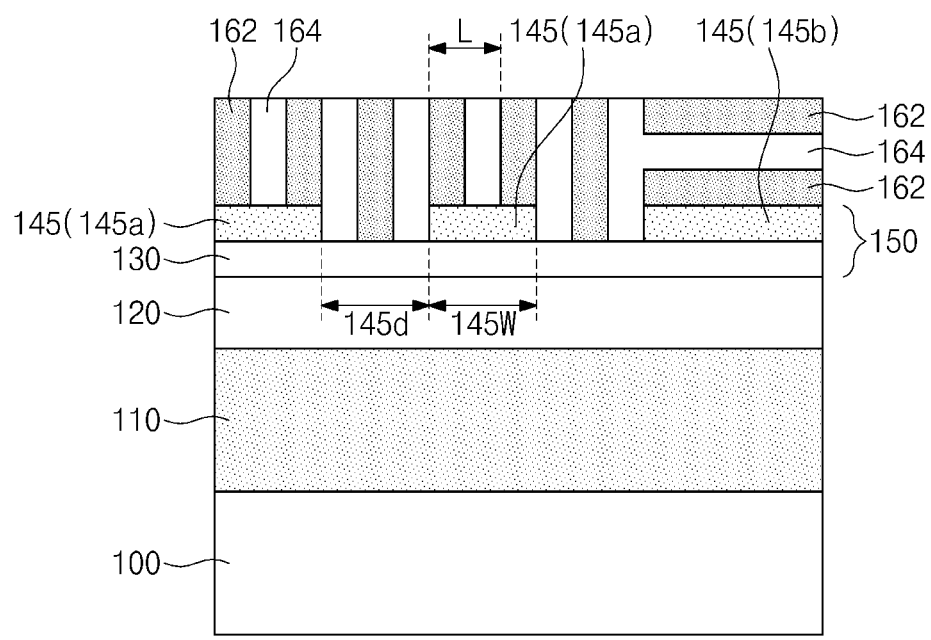

Referring to FIGS. 5A and 20, the block copolymer layer 160 may be phase-separated to form first patterns 162 and second patterns 164 on the self-assemble guide layer 150. The first polymer block and the second polymer block may have a volume ratio of about 1:1 in the block copolymer layer 160, and thus, the block copolymer layer 160 may be phase-separated into a lamellar structure including the first and second polymer blocks that are alternately and repetitively disposed relative to one another. In this case, the pitch of the first polymer blocks may be uniform in the phase separation state.

Each of the first patterns 162 may comprise the first polymer block, and each of the second patterns 164 may comprise the second polymer block. That is, the pitch L of the first patterns 162 may be uniform. In some examples, the width 145W of each of the narrow fixing patterns 145a may be 1.5 times the pitch L of the first patterns 162 (i.e., 145W=1.5L), and the distance 145d between the fixing patterns 145 may be 1.5 times the pitch L of the first patterns 162 (i.e., 145d=1.5L). In this case, the number of the first patterns 162 fixed on each of the narrow fixing patterns 145a may be n, and the number of the second patterns 164 disposed on each of the narrow fixing patterns 145a may be n−1 (wherein n is an integer of 2 or more). Moreover, the number of the first patterns 162 on the anti-reflective layer 130 between the fixing patterns 145 may be n−1, and the number of the second patterns 164 on the anti-reflective layer 130 between the fixing patterns 145 may be n (wherein n is an integer of 2 or more).

Figure 21:
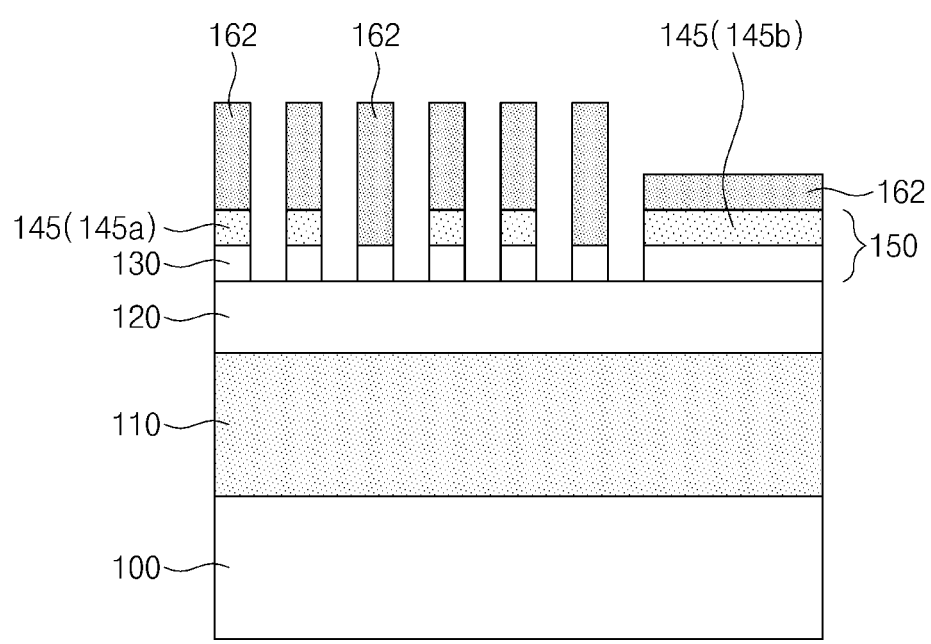

Referring to FIGS. 6A and 21, the second patterns 164 may be selectively removed. The removing of the second patterns 164 may comprise etching the anti-reflective layer 130 and the fixing patterns 145 (i.e., the narrow fixing patterns 145a) under the second patterns 164 so as to expose a top surface of the upper mask layer 120.

Subsequent processes may be substantially the same as those described with reference to FIGS. 7A through 9A and 7B through 9B.

Figure 22:
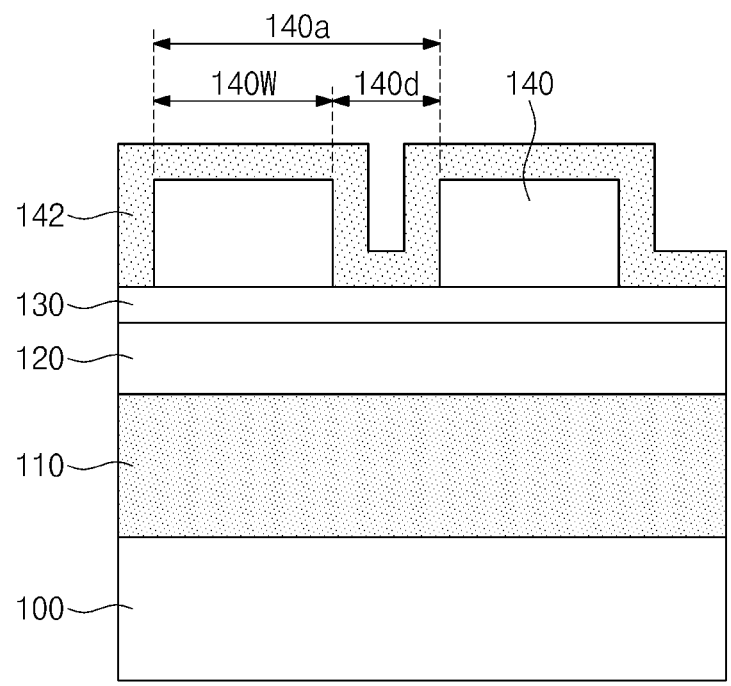
FIGS. 22, 23 and 24 are cross-sectional views, respectively corresponding to cross-sectional profiles taken along line A-A' of FIGS. 1A, 3A, and 5A, illustrating examples of a method of forming fine patterns according to the present inventive concept.
Figure 23:
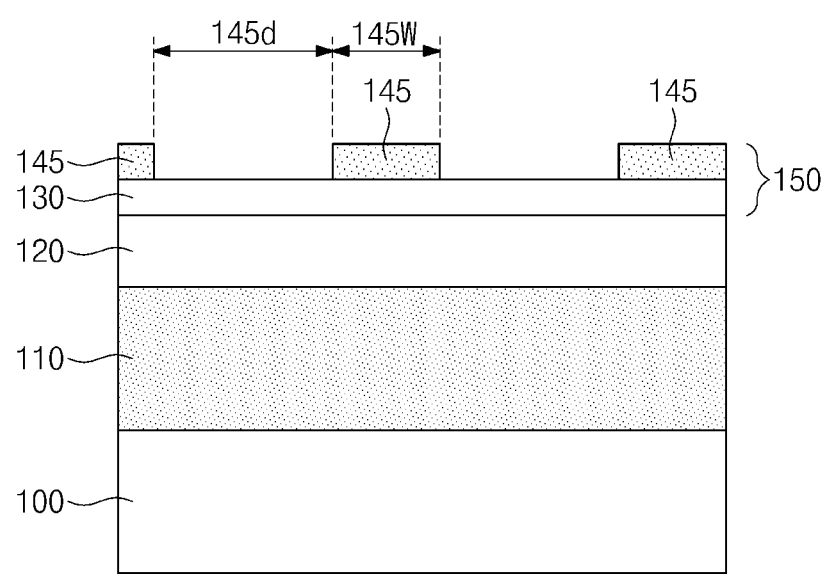
Figure 24:
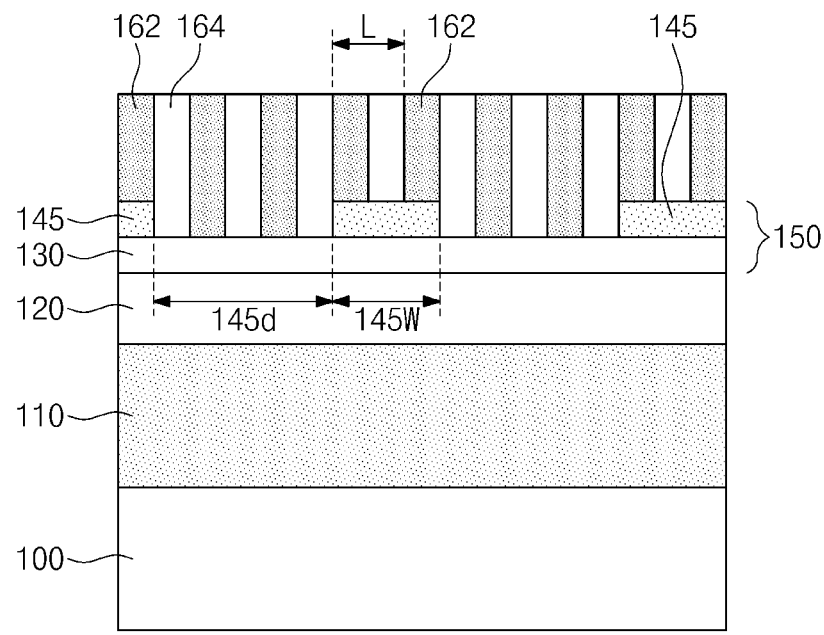

FIGS. 22 through 24 are cross-sectional views, respectively corresponding to cross-sectional profiles taken along line A-A' of FIGS. 1A, 3A, and 5A, and together illustrate other examples of a method of forming fine patterns according to the present inventive concept. In the description that follows, mainly the aspects of these examples different from those shown in and described with reference to FIGS. 18 through 21 may be described for the sake of brevity.

Referring to FIGS. 1A and 22, a pitch 140a of photoresist patterns 140 may be a sum of a width 140W of the photoresist pattern 140 in the second direction D2 and a distance 140d between the adjacent photoresist patterns 140 in the second direction D2. A ratio of the width 140W to the distance 140d may be about 5:3. A polymer layer 142 may be formed on an anti-reflective layer 130 on which the photoresist patterns 140 are formed. The polymer layer 142 may cover the photoresist patterns 140 and further cover a top surface of the anti-reflective layer 130 between the photoresist patterns 140.

Referring to FIGS. 3A and 23, the polymer layer 142 may be used to form, on the anti-reflective layer 130, fixing patterns 145 that are spaced apart from each other in the second direction D2. In some examples, the fixing patterns 145 may correspond to the narrow fixing patterns 145a described with reference to FIGS. 3A and 19. Because the fixing patterns 145 are formed to be spaced apart from each other in the second direction D2, the top surface of the anti-reflective layer 130 may be exposed at locations between the fixing patterns 145.

Each of the fixing patterns 145 may have a width 145W in the second direction D2, and the width 145W of each of the fixing patterns 145 may be substantially the same as a distance 140d between the photoresist patterns 140. A distance 145d in the second direction D2 between the fixing patterns 145 may be substantially the same as the width 140W of each of the photoresist patterns 140. In other words, the pitch 140a of the photoresist patterns 140 may be substantially the same as a sum of the width 145W of each of the fixing patterns 145 and the distance 145d between the fixing patterns 145. In some examples, a ratio of the distance 145d between the fixing patterns 145 to the width 145W of each of the fixing patterns 145 may be about 5:3.

The anti-reflective layer 130 and the fixing patterns 145 may define a self-assemble guide layer 150. A block copolymer layer 160 may be formed on the self-assemble guide layer 150, as described with reference to FIGS. 4A and 4B. The block copolymer layer 160 may comprise a block copolymer that includes first and second polymer blocks which are different from each other and are linked each other through a covalent bond.

Referring to FIGS. 5A and 24, the block copolymer layer 160 may be phase-separated to form first patterns 162 and second patterns 164 on the self-assemble guide layer 150. Each of the first patterns 162 may comprise the first polymer block, and each of the second patterns 164 may comprise the second polymer block. The pitch L of the first patterns 162 may be uniform. In some examples, the distance 145d between the fixing patterns 145 may be 2.5 times the pitch L of the first patterns 162 (i.e., 145d=2.5L), and the width 145W of each of the fixing patterns 145 may be 1.5 times the pitch L of the first patterns 162 (i.e., 145W=1.5L). In this case, the number of the first patterns 162 fixed on each of the fixing patterns 145 may be n, and the number of the second patterns 164 disposed on each of the fixing patterns 145 may be n−1 (wherein n is an integer of 2 or more). Moreover, the number of the first patterns 162 on the anti-reflective layer 130 between the fixing patterns 145 may be n, and the number of the second patterns 164 on the anti-reflective layer 130 between the fixing patterns 145 may be n+1 (wherein n is an integer of 2 or more).

Subsequent processes may be substantially the same as those described with reference to FIGS. 6A through 9A and 6B through 9B.

Figure 25:
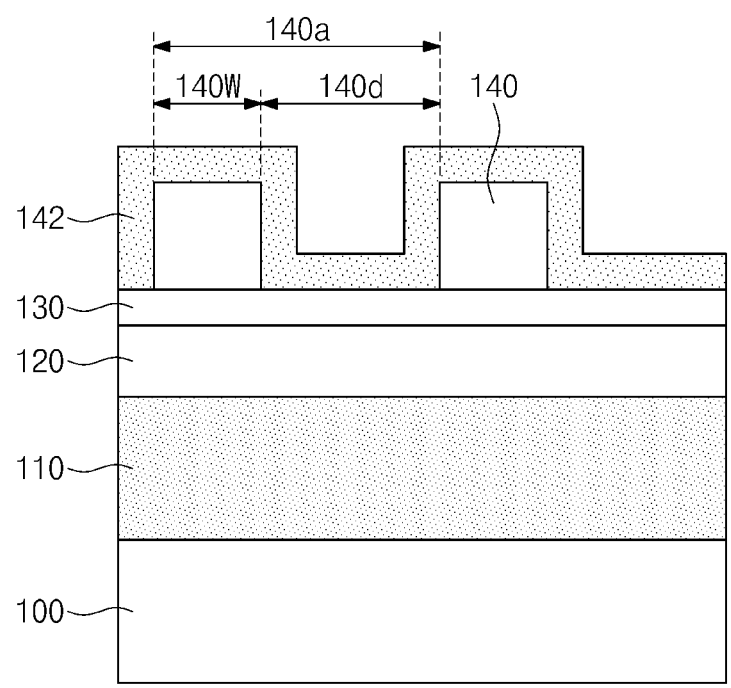
FIGS. 25, 26 and 27 are cross-sectional views, respectively corresponding to cross-sectional profiles taken along line A-A' of FIGS. 1A, 3A, and 5A, illustrating examples of a method of forming fine patterns according to the present inventive concept.
Figure 26:
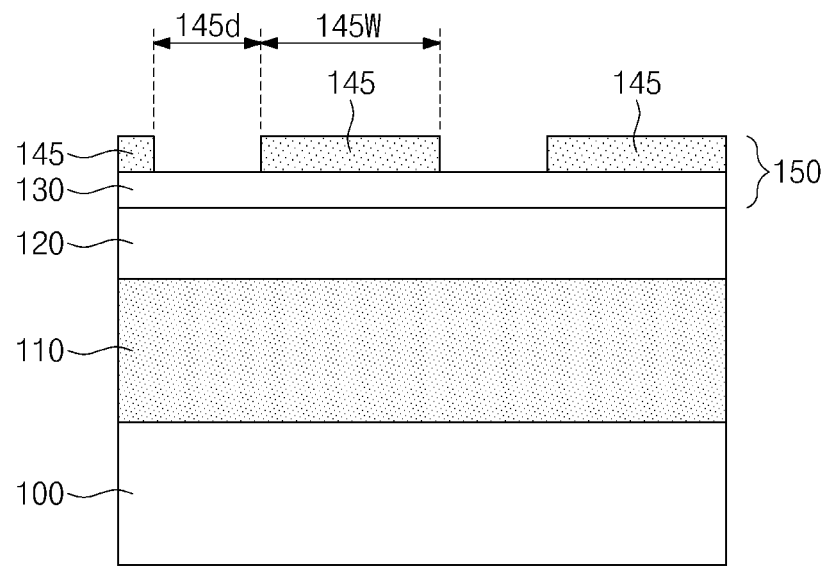
Figure 27:
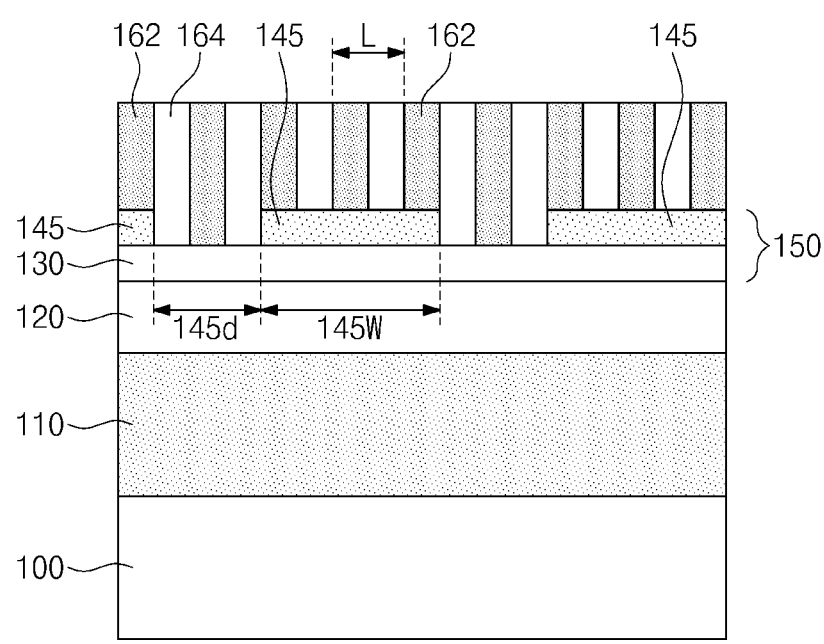

FIGS. 25 through 27 are cross-sectional views, respectively corresponding to cross-sectional profiles taken along line A-A' of FIGS. 1A, 3A, and 5A, and together illustrate still other examples of a method of forming fine patterns according to the present inventive concept. In the description that follows, mainly the aspects of the examples different from those of FIGS. 18 through 21 may be described for the sake of brevity.

Referring to FIGS. 1A and 25, a pitch 140a of photoresist patterns 140 may be a sum of a width 140W of the photoresist pattern 140 in the second direction D2 and a distance 140d between the adjacent photoresist patterns 140 in the second direction D2. A ratio of the width 140W to the distance 140d may be about 3:5. A polymer layer 142 may be formed on an anti-reflective layer 130 on which the photoresist patterns 140 are formed. The polymer layer 142 may cover the photoresist patterns 140 and further cover a top surface of the anti-reflective layer 130 between the photoresist patterns 140.

Referring to FIGS. 3A and 26, the polymer layer 142 may be used to form, on the anti-reflective layer 130, fixing patterns 145 that are spaced apart from each other in the second direction D2. In some examples, the fixing patterns 145 may correspond to the narrow fixing patterns 145a described with reference to FIGS. 3A and 19. Because the fixing patterns 145 are formed to be spaced apart from each other in the second direction D2, the top surface of the anti-reflective layer 130 may be partially exposed at between the fixing patterns 145.

Each of the fixing patterns 145 may have a width 145W in the second direction D2, and each width 145W of the fixing patterns 145 may be substantially the same as a distance 140d between the photoresist patterns 140. A distance 145d in the second direction D2 between the fixing patterns 145 may be substantially the same as the width 140W of each of the photoresist patterns 140. In other words, the pitch 140a of the photoresist patterns 140 may be substantially the same as a sum of the width 145W of each of the fixing patterns 145 and the distance 145d between the fixing patterns 145. In some examples, a ratio of the distance 145d between the fixing patterns 145 to the width 145W of each of the fixing patterns 145 may be about 3:5.

The anti-reflective layer 130 and the fixing patterns 145 may define a self-assemble guide layer 150. A block copolymer layer 160 may be formed on the self-assemble guide layer 150, as described with reference to FIGS. 4A and 4B. The block copolymer layer 160 may comprise a block copolymer that includes first and second polymer blocks which are different from each other and are linked each other through a covalent bond.

Referring to FIGS. 5A and 27, the block copolymer layer 160 may be phase-separated to form first patterns 162 and second patterns 164 on the self-assemble guide layer 150. Each of the first patterns 162 may comprise the first polymer block, and each of the second patterns 164 may comprise the second polymer block. The pitch L between the first patterns 162 may be uniform. In some examples, the distance 145d between the fixing patterns 145 may be 1.5 times the pitch L of the first patterns 162 (i.e., 145d=1.5L), and the width 145W of each of the fixing patterns 145 may be 2.5 times the pitch L of the first patterns 162 (i.e., 145W=2.5L). In this case, the number of the first patterns 162 fixed on each of the fixing patterns 145 may be n+1, and the number of the second patterns 164 disposed on each of the fixing patterns 145 may be n (wherein n is an integer of 2 or more). Moreover, the number of the first patterns 162 on the anti-reflective layer 130 between the fixing patterns 145 may be n−1, and the number of the second patterns 164 on the anti-reflective layer 130 between the fixing patterns 145 may be n (wherein n is an integer of 2 or more).

Subsequent processes may be substantially the same as those described with reference to FIGS. 6A through 9A and 6B through 9B.

According to the present inventive concept, the self-assemble layer may be formed using the anti-reflective layer having a non-selective neutral interfacial energy with respect to the different first and second polymer blocks and the fixing patterns having a relatively high interfacial energy with respect to the first polymer block. Therefore, the block copolymer layer including the first and second polymer blocks may be phase-separated and the self-assemble guide layer may allow the phase-separated block copolymer to be self-assembled, thereby easily forming fine patterns at a fine pitch.

Moreover, the upper mask layer including an inorganic compound may be provided as interposed between the self-assemble guide layer and the lower mask layer which includes an organic compound. When ashing and/or strip processes is/are performed to form again patterns on the upper mask layer, the second mask layer may protect the lower mask layer during the ashing and/or strip processes. As a result, it may be possible to easily perform a rework for forming again patterns on the upper mask layer.

It therefore is possible to easily form fine patterns and to easily perform a rework. Accordingly, a method of forming fine patterns according to the inventive concept is capable of reducing the cost of fabricating a semiconductor device.

Although the inventive concept has been described in connection with various examples illustrated in the accompanying drawings, it is not limited thereto. It will be apparent to those skilled in the art that various substitution, modifications and changes may be to the disclosed examples without departing from the scope and spirit of the inventive concept.

What is claimed is:

1. A method of forming fine patterns, the method comprising:
    forming a mask on an etching target layer;
    forming anti-reflective patterns and fixing patterns on the mask such that top surfaces of the anti-reflective patterns and the fixing patterns are exposed, wherein bottom surfaces of the anti-reflective patterns and the fixing patterns are in contact with the mask;
    forming a block copolymer layer that covers the top surfaces of the anti-reflective patterns and the fixing patterns, the block copolymer layer including a first polymer block and a second polymer block different from each other; and
    phase-separating the block copolymer layer to form first patterns and second patterns on the anti-reflective patterns and the fixing patterns,
    wherein each of the first patterns includes the first polymer block, and each of the second patterns includes the second polymer block, and
    wherein the anti-reflective patterns have a non-selective neutral interfacial energy with respect to the first polymer block and the second polymer block, the fixing patterns have a higher interfacial energy with respect to the first polymer block than the second polymer block, and the first and second patterns are arranged alternately and repetitively on uppermost surfaces of the anti-reflective patterns between the fixing patterns.

2. The method of claim 1, wherein the fixing patterns each have a linear shape, each extend longitudinally in a first direction parallel to a top surface of the etching target layer and are spaced apart from each other in a second direction parallel to the top surface of the etching target layer, and the second direction crossing the first direction, and
    the first and second patterns each have a linear shape, each extend longitudinally in the first direction and are alternately and repetitively arranged in the second direction.

3. The method of claim 2, wherein a number of the first patterns fixed on each of the fixing patterns is n, and a number of the second patterns disposed on each of the fixing patterns is n−1, wherein n is an integer of 2 or more.

4. The method of claim 2, wherein the block copolymer layer is phase-separated to form a lamellar structure including the first polymer block and the second polymer block that are alternately and repetitively disposed relative to one another.

5. The method of claim 2, wherein each of the fixing patterns has a width in the second direction, the width of each of the fixing patterns being 1.5 or 2.5 times a pitch of the first patterns in the second direction.

6. The method of claim 1, wherein the mask comprises a silicon-containing inorganic compound.

7. The method of claim 6, wherein the mask includes an upper mask layer of the silicon-containing inorganic compound, and the method further comprising:
    forming a lower mask layer on the etching target layer such that the lower mask layer is located between the etching target layer and the upper mask layer, wherein the lower mask layer includes at least 80% by weight of carbon.

8. The method of claim 1, wherein the fixing patterns comprise a polymer substantially the same as that of the first polymer block.

9. The method of claim 1, further comprising:
    removing the second patterns; and
    etching the mask using the first patterns as an etch mask to form mask patterns,
    wherein removing the second patterns includes etching the anti-reflective patterns and the fixing patterns under the second patterns to expose a top surface of the mask.

10. The method of claim 1, wherein forming the anti-reflective patterns and the fixing patterns comprises:
    forming an anti-reflective layer on the mask;
    forming photoresist patterns on the anti-reflective layer;
    etching the anti-reflective layer using the photoresist patterns as an etch mask to form openings that expose a top surface of the mask;
    removing the photoresist patterns after forming the openings;
    forming, on the anti-reflective layer, a polymer layer that fills the openings;
    reacting the polymer layer with the mask which is exposed through the openings; and
    removing a portion of the polymer layer which was not reacted with the mask.

11. The method of claim 10, wherein the mask comprises silanol (Si—OH) as a functional group thereof, and the polymer layer comprises a polymer including a functional group at an end or backbone thereof, the functional group being covalently bonded with silanol (Si—OH) of the mask in the reacting of the polymer layer with the mask.

12. The method of claim 11, wherein the polymer layer comprises at least one of a hydroxyl (—OH) group and a carboxyl (—COOH) group.

13. The method of claim 1, wherein the anti-reflective patterns include an organic ARC material.

14. A method of forming fine patterns, the method comprising:
    forming a mask on an etch target;
    forming a self-assemble guide layer structure on the mask, the self-assemble guide layer structure comprising anti-reflective (AR) patterns and fixing patterns, wherein the AR patterns and the fixing patterns are arranged alternately and repetitively on the mask, wherein top surfaces of the AR patterns and the fixing patterns are exposed, and wherein bottom surfaces of the AR patterns and the fixing patterns are in contact with the mask;
    forming a layer of a block copolymer directly on the exposed top surfaces of the AR patterns and the fixing patterns of the self-assemble guide layer structure, the block copolymer including first and second blocks of different polymers;
    treating the block copolymer layer to cause the first and second blocks to self-arrange on the top surfaces of the AR patterns and the fixing patterns of the self-assemble guide layer structure, thereby forming first patterns and second patterns of the first and second blocks, respectively, wherein the first and second patterns are arranged alternately on uppermost surfaces of the AR patterns;
    removing the second patterns; and
    subsequently performing an etch process using the first patterns as an etch mask.

15. The method of claim 14, wherein the forming of the mask comprises forming a lower mask layer including at least 80% by weight of carbon on the etching target, and forming an upper mask layer of a silicon-based inorganic compound on the lower mask layer.

16. The method of claim 15, wherein the forming of the self-assemble guide layer structure comprises:
- coating the upper mask layer with a layer of anti-reflective material,
- forming a photoresist pattern on the layer of anti-reflective material,
- etching the layer of anti-reflective material using the photoresist pattern as an etch mask to form said anti-reflective patterns, wherein the anti-reflective patterns have openings therethrough that expose the upper mask layer,
- subsequently removing the photoresist pattern and forming a polymer layer that fills the openings, and
- facilitating a reaction between the polymer layer and the upper mask layer to form the fixing patterns.

* * * * *